(12) United States Patent
Liu

(10) Patent No.: US 11,510,327 B2
(45) Date of Patent: *Nov. 22, 2022

(54) ELECTRONIC DEVICE

(71) Applicant: BEIJING XIAOMI MOBILE SOFTWARE CO., LTD., Beijing (CN)

(72) Inventor: Zhenhua Liu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/331,490

(22) Filed: May 26, 2021

(65) Prior Publication Data
US 2022/0132688 A1    Apr. 28, 2022

(30) Foreign Application Priority Data

Oct. 27, 2020 (CN) .......................... 202011167527.5

(51) Int. Cl.
*H05K 5/02* (2006.01)
(52) U.S. Cl.
CPC .................................. *H05K 5/0217* (2013.01)
(58) Field of Classification Search
CPC ........................... H05K 5/0217; G06F 1/1652
See application file for complete search history.

(56) References Cited

U.S. PATENT DOCUMENTS

| | | | |
|---|---|---|---|
| 8,073,508 B2* | 12/2011 | Park | H04M 1/0237 455/575.4 |
| 10,506,726 B2* | 12/2019 | Kang | H05K 5/0247 |
| 10,789,863 B2* | 9/2020 | Song | H05K 1/189 |
| 10,972,592 B2* | 4/2021 | Song | G06F 1/1652 |

(Continued)

FOREIGN PATENT DOCUMENTS

| CN | 108230937 A | 6/2018 |
|---|---|---|
| JP | 2005309086 A | 11/2005 |

(Continued)

OTHER PUBLICATIONS

Indian Patent Application No. 202144023913 Office Action dated May 24, 2022, 7 pages.

(Continued)

*Primary Examiner* — Hung S. Bui
*Assistant Examiner* — Sagar Shrestha
(74) *Attorney, Agent, or Firm* — Lathrop GPM LLP

(57) ABSTRACT

An electronic device includes a housing assembly, a sliding rail assembly, an elastic telescopic assembly and a flexible screen. The sliding rail assembly is assembled to the housing assembly and includes a sliding rail including opposite front and rear surfaces. The elastic telescopic assembly is located at the rear surface of the sliding rail and assembled to the housing assembly. The flexible screen has a part thereof provided at the front surface of the sliding rail and fixed to the housing assembly, and includes a telescopic end extending around an edge of the sliding rail to the rear surface of the sliding rail and coupled to the elastic telescopic assembly stressed by the telescopic end to extend and retract, and the sliding rail is slidable outwards from the housing assembly to extend the flexible screen and slidable towards the housing assembly from an outside to retract the flexible screen.

20 Claims, 37 Drawing Sheets

(56) References Cited

U.S. PATENT DOCUMENTS

| | | | |
|---|---|---|---|
| 10,976,778 B2* | 4/2021 | Pyo | H05K 5/0217 |
| 2007/0006421 A1* | 1/2007 | Park | H04M 1/0237 |
| | | | 16/334 |
| 2007/0082545 A1* | 4/2007 | Lee | H04M 1/0239 |
| | | | 439/567 |
| 2007/0146243 A1* | 6/2007 | Ou Yang | G06F 1/1601 |
| | | | 345/76 |
| 2012/0212433 A1* | 8/2012 | Lee | G06F 1/1643 |
| | | | 345/173 |
| 2012/0314400 A1* | 12/2012 | Bohn | G09F 9/35 |
| | | | 361/679.01 |
| 2013/0148276 A1* | 6/2013 | Yu | H04M 1/0237 |
| | | | 361/679.01 |
| 2014/0247544 A1* | 9/2014 | Ryu | G09F 11/18 |
| | | | 361/679.01 |
| 2016/0147261 A1* | 5/2016 | Bohn | G09F 9/35 |
| | | | 455/566 |
| 2018/0103550 A1* | 4/2018 | Seo | G06F 1/1601 |
| 2019/0250669 A1* | 8/2019 | Liao | A44C 5/00 |
| 2020/0201394 A1* | 6/2020 | Choi | H05K 5/0017 |
| 2020/0264660 A1* | 8/2020 | Song | G06F 1/1686 |
| 2020/0267246 A1* | 8/2020 | Song | H05K 1/148 |
| 2020/0304613 A1* | 9/2020 | Cha | G06F 1/1652 |
| 2021/0278878 A1* | 9/2021 | Shim | G06F 1/1681 |
| 2022/0129035 A1* | 4/2022 | Liu | G06F 1/1652 |
| 2022/0183167 A1* | 6/2022 | Liu | H04M 1/0237 |

FOREIGN PATENT DOCUMENTS

| | | |
|---|---|---|
| JP | 2010178188 A | 8/2010 |
| JP | 2020503589 A | 1/2020 |

OTHER PUBLICATIONS

Japanese Patent Application No. 2021-087543, Office Action dated Jul. 26, 2022, 4 pages.

Japanese Patent Application No. 2021-087543, English translation of Office Action dated Jul. 26, 2022, 4 pages.

* cited by examiner

ELECTRONIC DEVICE

CROSS-REFERENCE TO RELATED APPLICATION

This application claims priority to and benefits of Chinese Patent Application Serial No. 202011167527.5, filed with National Intellectual Property Administration of PRC on Oct. 27, 2020, the entire content of which is incorporated herein by reference as if set forth in its entirety.

FIELD

The present disclosure relates to a field of electronic devices, and particularly to an electronic device.

BACKGROUND

With the development of a flexible screen, screens of an electronic device have more and more abundant forms, such as foldable screens, surround screens, curved screens, or the like. As a volume of the electronic device becomes smaller and smaller, capacity of batteries becomes higher and higher, and the electronic device also has more flexible design forms. However, the foldable screen capable of performing display in different sizes has a large volume and is unable to satisfy user experiences, and therefore, it is particularly important to provide an electronic device which is suitable for miniaturization and meets use requirements of a user for screen sizes.

SUMMARY

An aspect of the present disclosure provides an electronic device, including: a housing assembly; a sliding rail assembly assembled to the housing assembly and including at least one sliding rail, the sliding rail including a front surface and a rear surface opposite to the front surface; at least one elastic telescopic assembly located at the rear surface of the sliding rail assembly and assembled to the housing assembly; and a flexible screen, part of the flexible screen being provided at the front surface of the sliding rail and fixed to the housing assembly, the flexible screen including at least one telescopic end extending around an edge of the sliding rail to the rear surface of the sliding rail, the telescopic end being coupled to the elastic telescopic assembly, the elastic telescopic assembly being stressed by the telescopic end to extend and retract, and the sliding rail being slidable outwards from the housing assembly to extend the flexible screen and slidable towards the housing assembly from an outside to retract the flexible screen.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with some aspects related to the disclosure as recited in the appended claims.

The terminology used herein is for the purpose of describing particular embodiments only and is not intended to be limiting of the disclosure. Unless defined otherwise, the technical or scientific terms used in the disclosure should have the same meanings as commonly understood by one of ordinary skilled in the art to which the present disclosure belongs. The terms "first", "second" and the like in the description and the claims of the present disclosure do not mean any sequential order, number or importance, but are only used for distinguishing different components. Similarly, the terms "a", "an" and the like do not denote a limitation of quantity, but denote the existence of at least one. Unless otherwise stated, the terms "comprises", "comprising", "includes", "including" and the like mean that the element or object in front of the "comprises", "comprising", "includes" and "including" encompasses the elements or objects and their equivalents illustrated following the "comprises", "comprising", "includes" and "including", but do not exclude other elements or objects. The term "coupled", "connected" or the like is not limited to being connected physically or mechanically, but may include electric connection, direct or indirect.

As used in the description of the present disclosure and the appended claims, "a" and "the" in singular forms mean including plural forms, unless clearly indicated in the context otherwise. It should also be understood that, as used herein, the term "and/or" represents and contains any one or all possible combinations of one or more associated listed items.

Figure 1:
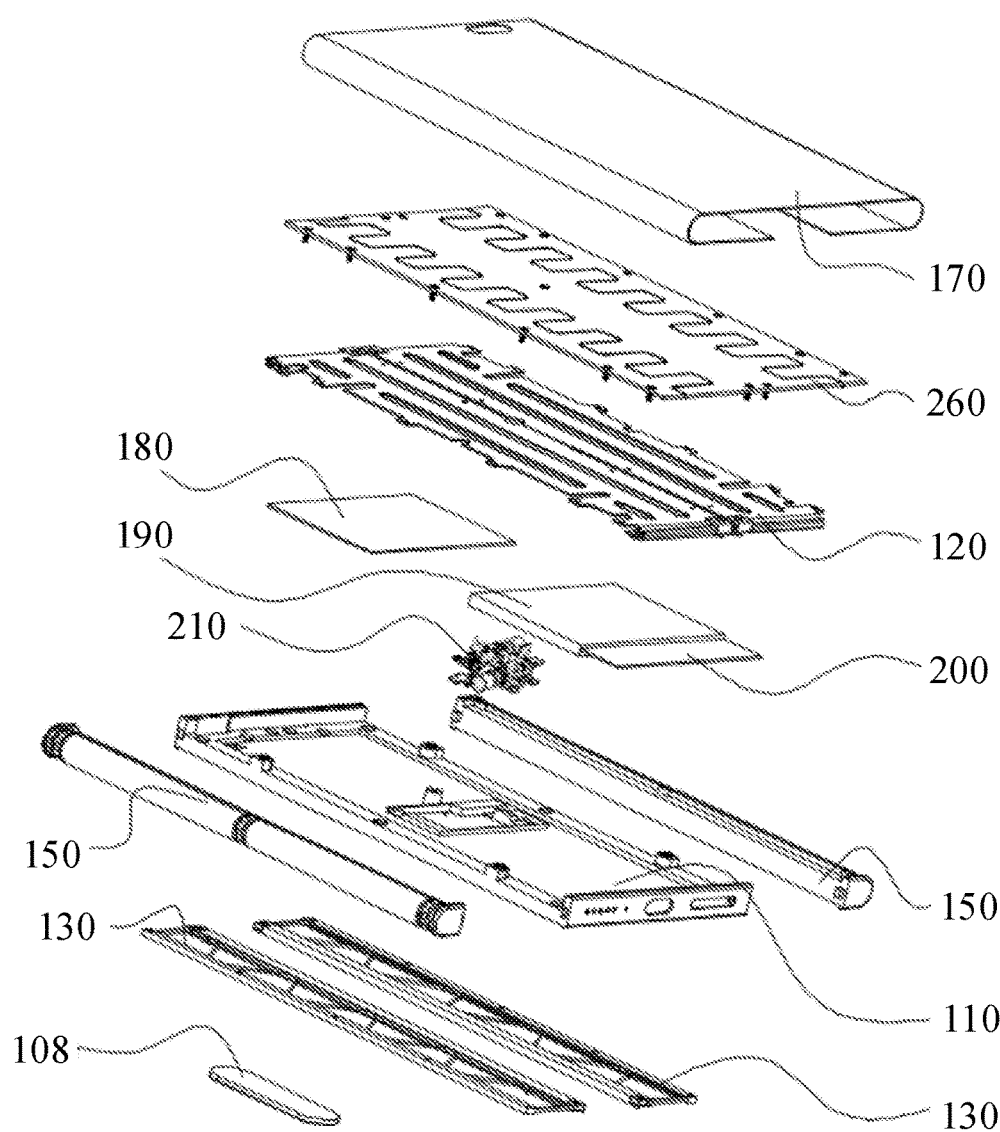
FIG. 1 shows a schematic exploded diagram of an electronic device according to an exemplary embodiment of the present disclosure.
Figure 2:
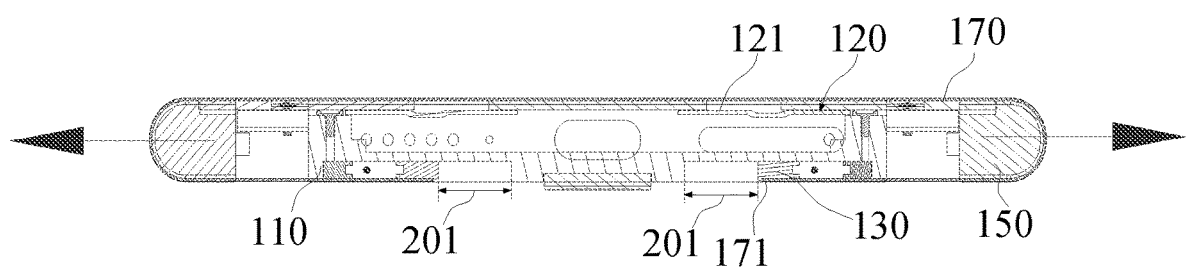
FIG. 2 shows a partial sectional view of an electronic device according to an exemplary embodiment of the present disclosure.
Figure 3:
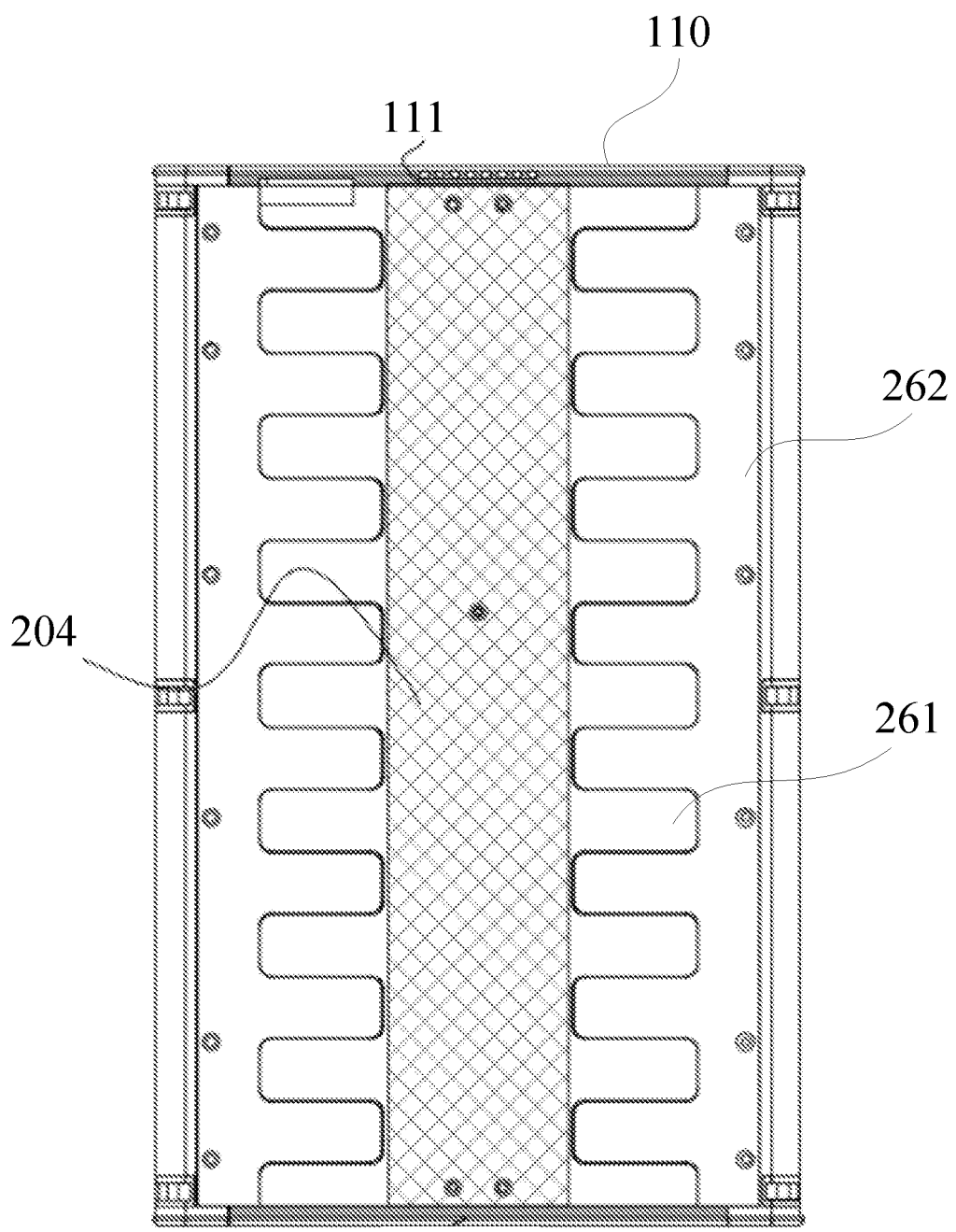
FIG. 3 shows a partial schematic diagram of a front surface of an electronic device according to an exemplary embodiment of the present disclosure.
Figure 4:
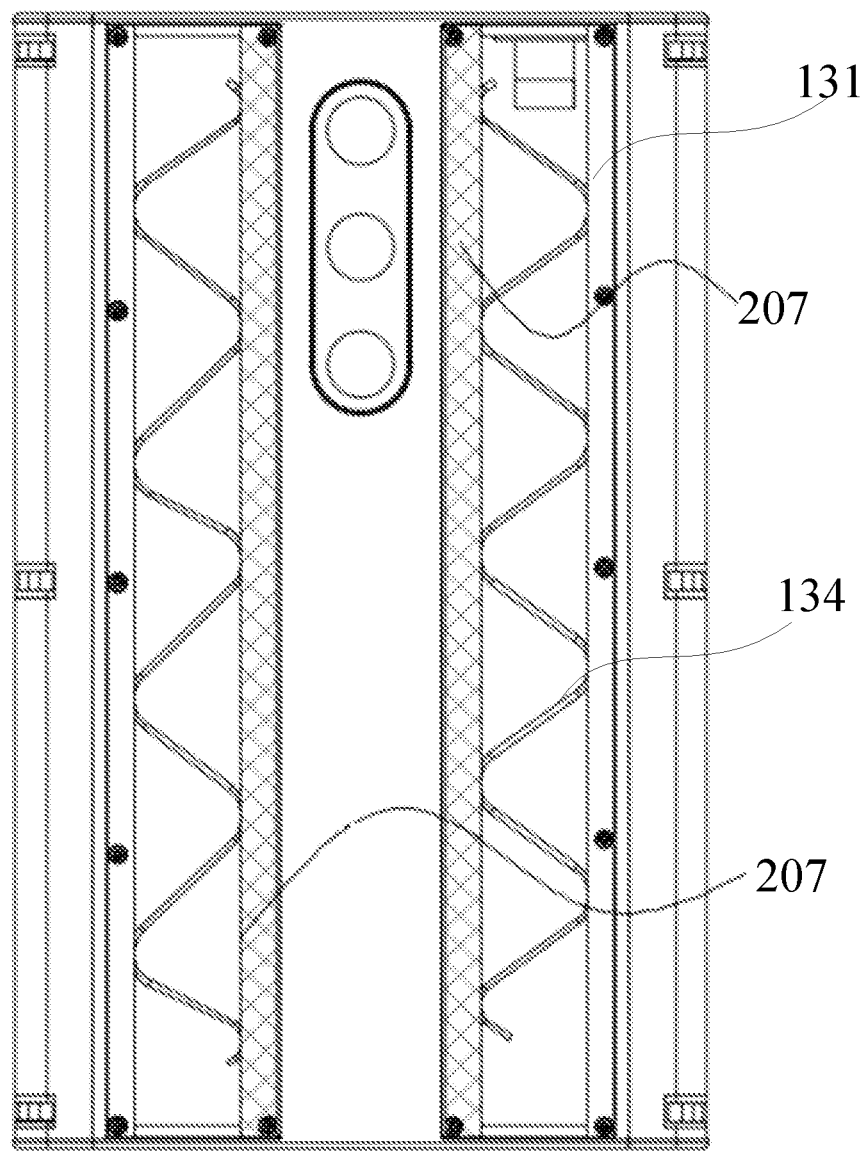
FIG. 4 shows a partial schematic diagram of a rear surface of an electronic device according to an exemplary embodiment of the present disclosure.

The electronic device according to the embodiments of the present disclosure includes, but is not limited to, a mobile phone, a tablet computer, an iPad, a digital broadcast terminal, a messaging apparatus, a game console, a medical apparatus, fittingness apparatus, a personal digital assistant, an intelligent wearable apparatus, an intelligent television, a floor sweeping robot, an intelligent sound box, a vehicle-mounted apparatus, or the like. For convenience of understanding, the following drawings are illustrated by taking a mobile phone as an example. FIG. 1 shows a schematic exploded diagram of an electronic device according to an exemplary embodiment of the present disclosure, FIG. 2 shows a partial sectional view of an electronic device according to an exemplary embodiment of the present disclosure, FIG. 3 shows a partial schematic diagram of a front surface of an electronic device according to an exemplary embodiment of the present disclosure, and FIG. 4 shows a partial schematic diagram of a rear surface of an electronic device according to an exemplary embodiment of the present disclosure. Referring to FIGS. 1 and 2, the electronic device according to some embodiments of the present disclosure includes a housing assembly 110, a sliding rail assembly 120, at least one elastic telescopic assembly 130 and a flexible screen 170.

The housing assembly 110 may include a middle frame providing support for components and parts of the electronic device. In an example, the housing assembly 110 may be made of a metal material, such as an aluminum alloy, and formed with CNC (Computerized Numerical Control Machine) machining and nano-injection molding processes.

The sliding rail assembly 120 is assembled to the housing assembly 110 and includes at least one sliding rail 121, and the sliding rail 121 includes a front surface and a rear surface opposite to the front surface. In an example, the number of the sliding rails 121 is two, three, four, or the like. When the number of the sliding rails 121 is two, the two sliding rails 121 may be slid towards and away from each other. It should be noted that the rear surface of the sliding rail 121 may face the middle frame.

The elastic telescopic assembly 130 is located at the rear surface of the sliding rail assembly 120 and assembled to the housing assembly 110. In an example, the number of the elastic telescopic assemblies 130 is the same as the number of the sliding rails 121; in other words, one sliding rail 121 corresponds to one elastic telescopic assembly 130.

Part of the flexible screen 170 is provided at the front surface of the sliding rail 121 and fixed to the housing assembly 110, and the flexible screen 170 includes at least one telescopic end 171 extending around an edge of the sliding rail 121 to the rear surface of the sliding rail 121. The telescopic end 171 is coupled to the elastic telescopic assembly 130, and the elastic telescopic assembly 130 is stressed by the telescopic end 171 to extend and retract, and the sliding rail 121 is slidable outwards from the housing assembly 110 to extend the flexible screen 170 and slidable towards the housing assembly 110 from an outside to retract the flexible screen 170. Thus, the flexible screen 170 may be in an extended state and a retracted state. In an example, the flexible screen 170 includes two telescopic ends 171, the sliding rail assembly 120 includes two sliding rails 121 arranged oppositely, and the number of the elastic telescopic assemblies 130 is two. A middle portion of the flexible screen 170 is fixed to the housing assembly 110, one telescopic end 171 of the flexible screen 170 extends around the edge of one sliding rail 121 to the rear surface of the sliding rail 121 and is coupled to one elastic telescopic assembly 130, and the other telescopic end 171 of the flexible screen 170 extends around the edge of the other sliding rail 121 to the rear surface of the sliding rail 121 and is coupled to the other elastic telescopic assembly 130. Referring to FIG. 3, the housing assembly 110 includes a first region 111 located at an edge of the housing assembly 110, and an edge of part of the flexible screen 170 may be glued to the first region 111 of the housing assembly 110. In an example, referring to FIG. 4, the elastic telescopic assembly 130 includes a second region 207 which may be located at a sliding member, and the telescopic end 171 is glued to the second region 207.

Figure 5:
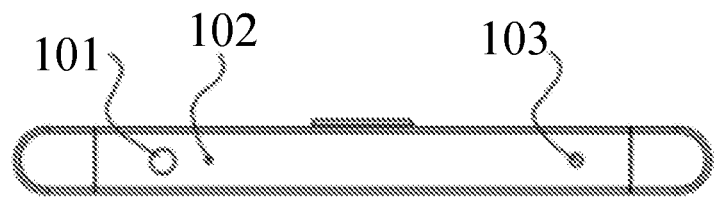
FIG. 5 shows a schematic diagram of a first side surface of an electronic device during retraction of a flexible screen according to an exemplary embodiment of the present disclosure.
Figure 6:
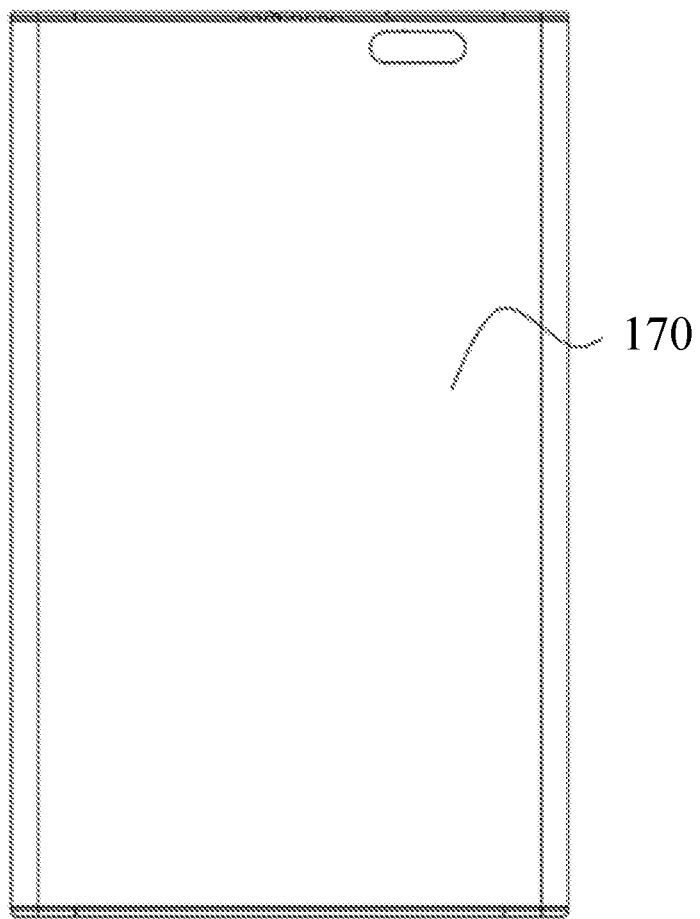
FIG. 6 shows a schematic diagram of a front surface of an electronic device during retraction of a flexible screen according to an exemplary embodiment of the present disclosure.
Figure 7:
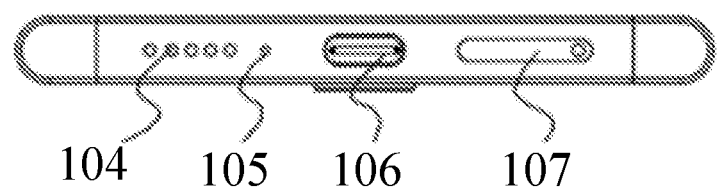
FIG. 7 shows a schematic diagram of a second side surface of an electronic device during retraction of a flexible screen according to an exemplary embodiment of the present disclosure.
Figure 8:
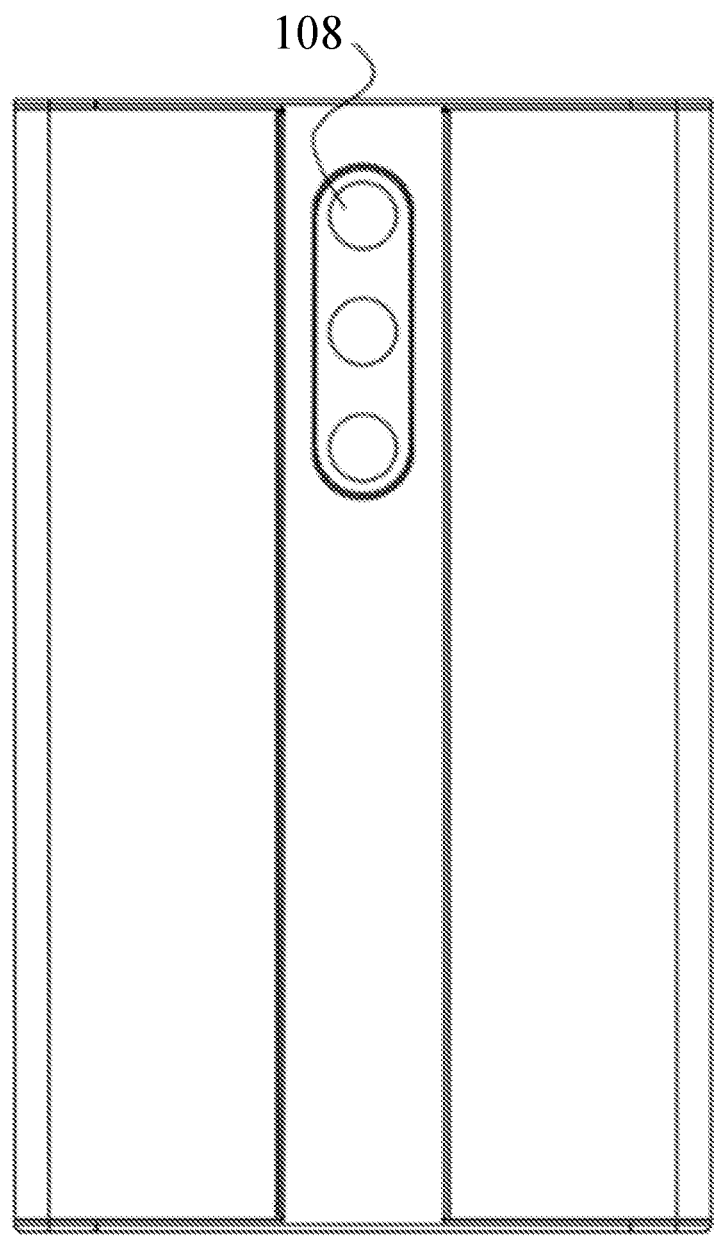
FIG. 8 shows a schematic diagram of a rear surface of an electronic device during retraction of a flexible screen according to an exemplary embodiment of the present disclosure.
Figure 9:
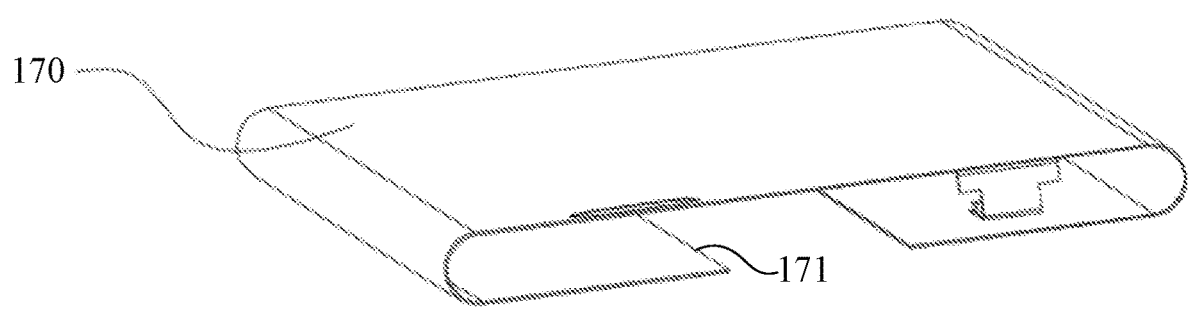
FIG. 9 shows a schematic diagram of a flexible screen in a retracted state according to an exemplary embodiment of the present disclosure.
Figure 10:
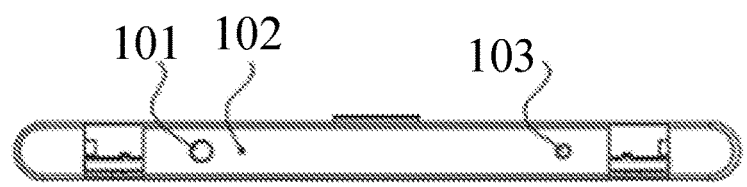
FIG. 10 shows a schematic diagram of a first side surface of an electronic device during extension of a flexible screen according to an exemplary embodiment of the present disclosure.
Figure 11:
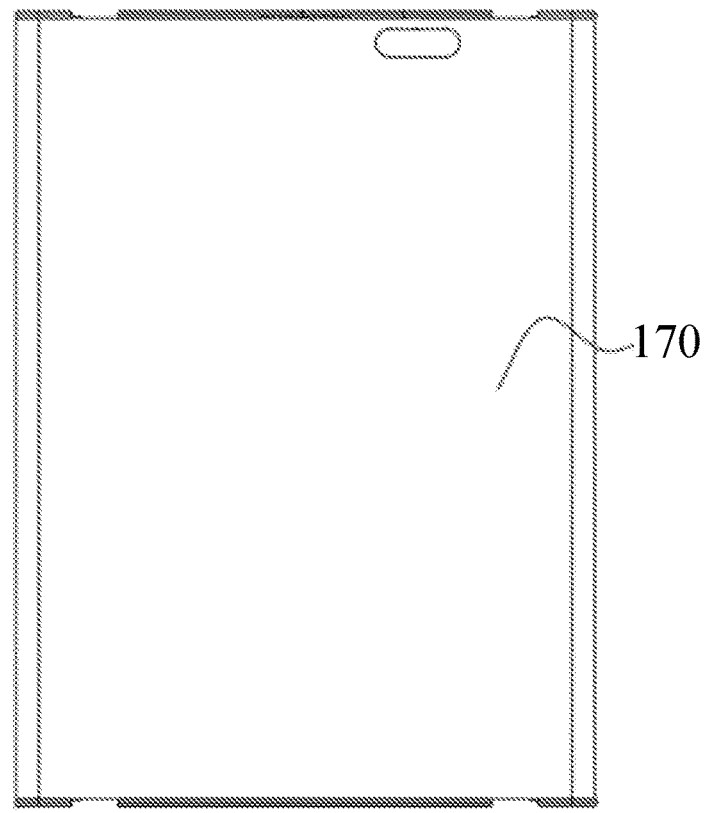
FIG. 11 shows a schematic diagram of a front surface of an electronic device during extension of a flexible screen according to an exemplary embodiment of the present disclosure.
Figure 12:
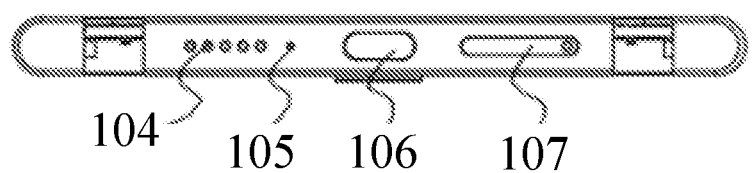
FIG. 12 shows a schematic diagram of a second side surface of an electronic device during extension of a flexible screen according to an exemplary embodiment of the present disclosure.
Figure 13:
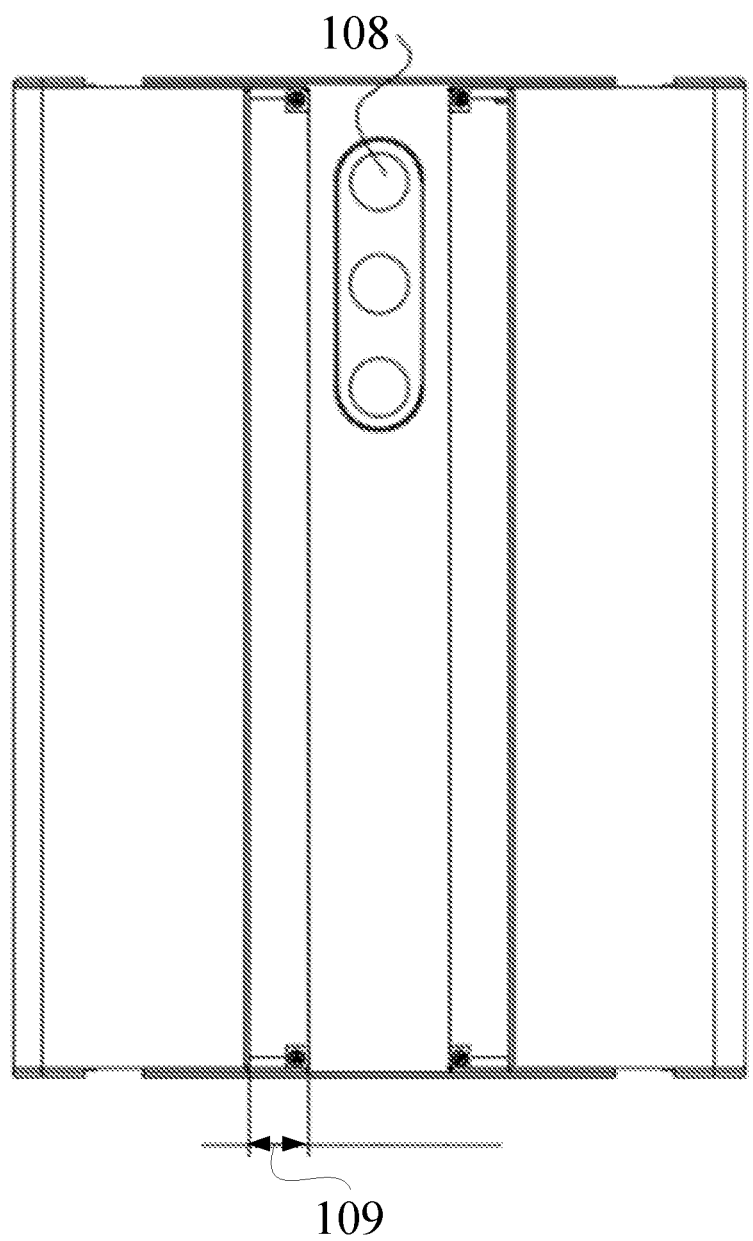
FIG. 13 shows a schematic diagram of a rear surface of an electronic device during extension of a flexible screen according to an exemplary embodiment of the present disclosure.
Figure 14:
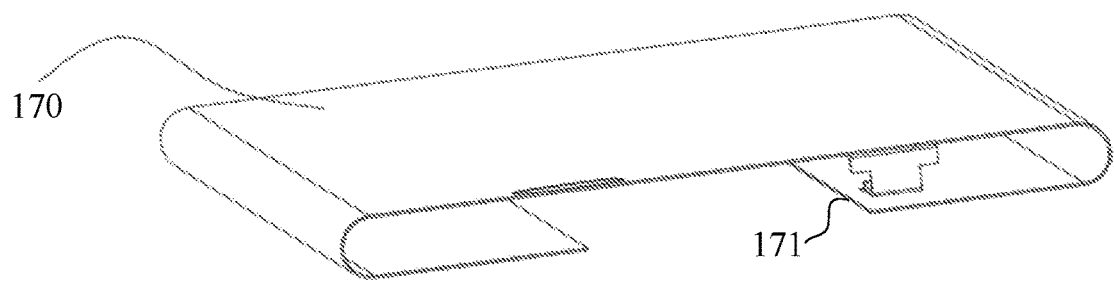
FIG. 14 shows a schematic diagram of a flexible screen in an extended state according to an exemplary embodiment of the present disclosure.

FIG. 5 shows a schematic diagram of a first side surface of an electronic device during retraction of a flexible screen according to an exemplary embodiment of the present disclosure, FIG. 6 shows a schematic diagram of a front surface of an electronic device during retraction of a flexible screen according to an exemplary embodiment of the present disclosure, FIG. 7 shows a schematic diagram of a second side surface of an electronic device during retraction of a flexible screen according to an exemplary embodiment of the present disclosure, FIG. 8 shows a schematic diagram of a rear surface of an electronic device during retraction of a flexible screen according to an exemplary embodiment of the present disclosure, FIG. 9 shows a schematic diagram of a flexible screen 170 in a retracted state according to an exemplary embodiment of the present disclosure, FIG. 10 shows a schematic diagram of a first side surface of an electronic device during extension of a flexible screen according to an exemplary embodiment of the present disclosure, FIG. 11 shows a schematic diagram of a front surface of an electronic device during extension of a flexible screen according to an exemplary embodiment of the present disclosure, FIG. 12 shows a schematic diagram of a second side surface of an electronic device during extension of a flexible screen according to an exemplary embodiment of the present disclosure; FIG. 13 shows a schematic diagram of a rear surface of an electronic device during extension of a flexible screen according to an exemplary embodiment of the present disclosure, and FIG. 14 shows a schematic diagram of a flexible screen 170 in an extended state according to an exemplary embodiment of the present disclosure. Referring to FIG. 5, the first side surface of the electronic device is provided with a headphone jack 101, a first microphone hole 102, and an infrared function lamp 103. Referring to FIG. 6, the flexible screen 170 has a size for a general use state (such as a general use state of a mobile phone). Referring to FIG. 7, a speaker sound outlet hole 104, a second microphone hole 105, a USB interface 106, and a SIM card holder 107 are provided at the second side surface of the electronic device. Referring to FIG. 8, the rear surface of the electronic device is provided with a camera module 108. Referring to FIG. 9, a greater part of the flexible screen 170 is retracted from both ends thereof. Referring to FIGS. 5 to 9, when the flexible screen 170 is in the retracted state, the electronic device may be in a general use state, and at this point, the electronic device has a small volume, such as a normal use state of a mobile phone. With reference to FIGS. 2 and 10 to 14, when the first side surface of the electronic device is extended, the flexible screen 170 is extended, the second side surface of the electronic device is extended, and the rear surface is extended; and when the flexible screen 170 is in the extended state, compared with the retracted state of the flexible screen 170, an effective use area of the flexible screen 170 is increased to improve use experiences of a user, for example, a screen size of a mobile phone may be formed into a screen size for a tablet computer. In FIG. 2, 201 may be a maximum distance 201 by which the flexible screen 170 can be extended.

The electronic device may further include a first circuit board 180, a battery assembly 190, and a second circuit board 200. The first circuit board 180 may be configured as a main board, and the second circuit board 200 may be configured as a battery protection board, and is coupled to the battery assembly 190.

In the electronic device according to the embodiments of the present disclosure, part of the flexible screen 170 is provided at the front surface of the sliding rail 121 and fixed to the housing assembly 110, the telescopic end 171 extends around the edge of the sliding rail 121 to the rear surface of the sliding rail 121 and is coupled to the elastic telescopic assembly 130. When the sliding rail 121 is slid outwards from the housing assembly 110, the telescopic end 171 pulls the elastic telescopic assembly 130, and the flexible screen 170 is stably extended under a buffer effect of the elastic telescopic assembly 130. When the sliding rail 121 is slid from the outside to the housing assembly 110, the elastic telescopic assembly 130 may restore, and the flexible screen 170 is stably retracted under the buffer effect of the elastic telescopic assembly 130. The flexible screen 170 of the electronic device may be stably extended and retracted, such that a user may conveniently use screens with different sizes, thus improving user experiences; and compared with a foldable screen, the electronic device has a reduced weight , and is convenient for the user to carry.

Figure 15:
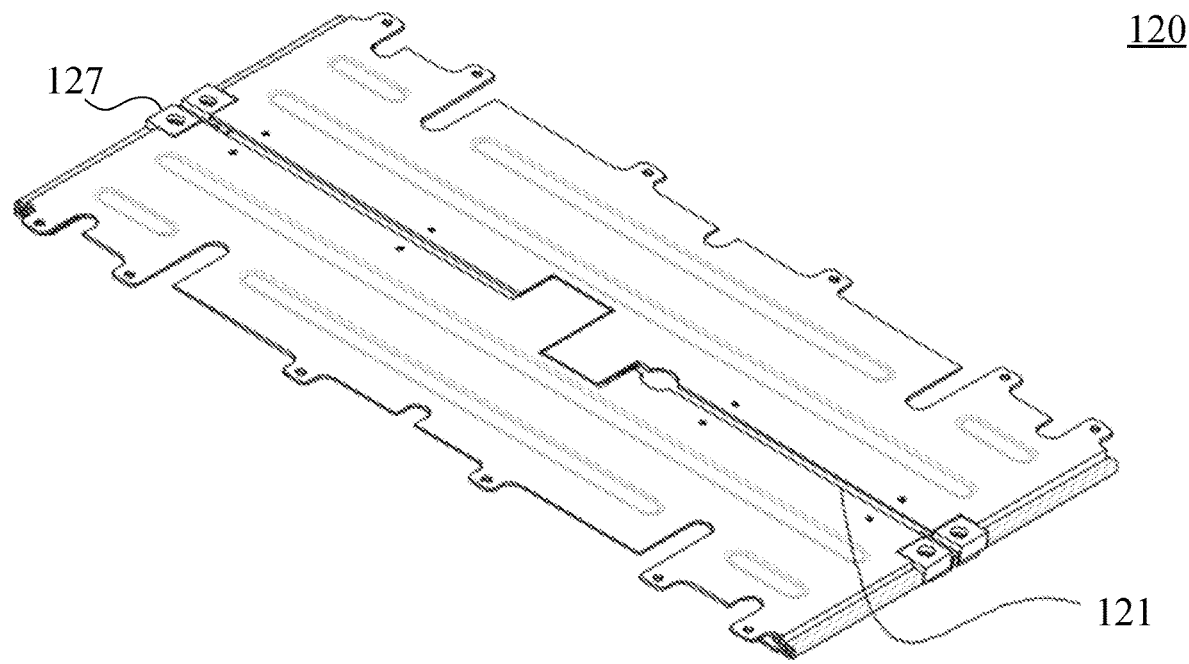
FIG. 15 shows a schematic structural diagram of a sliding rail assembly in a retracted state according to an exemplary embodiment of the present disclosure.
Figure 16:
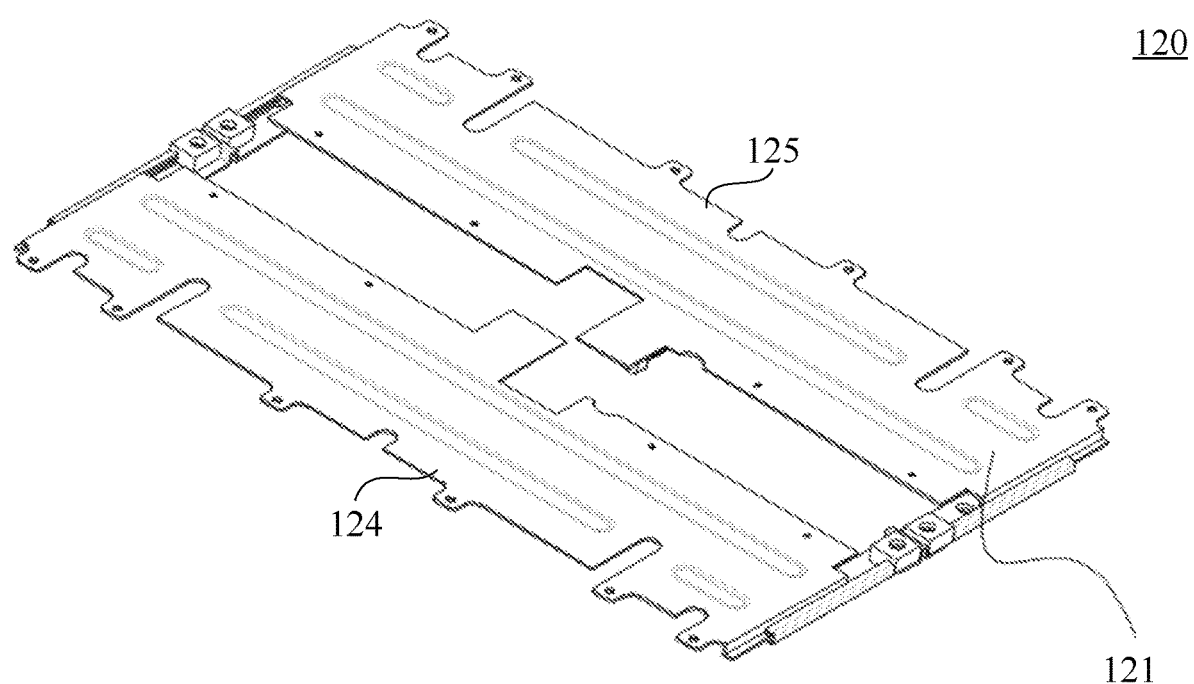
FIG. 16 shows a schematic structural diagram of a sliding rail assembly in an extended state according to an exemplary embodiment of the present disclosure.
Figure 17:
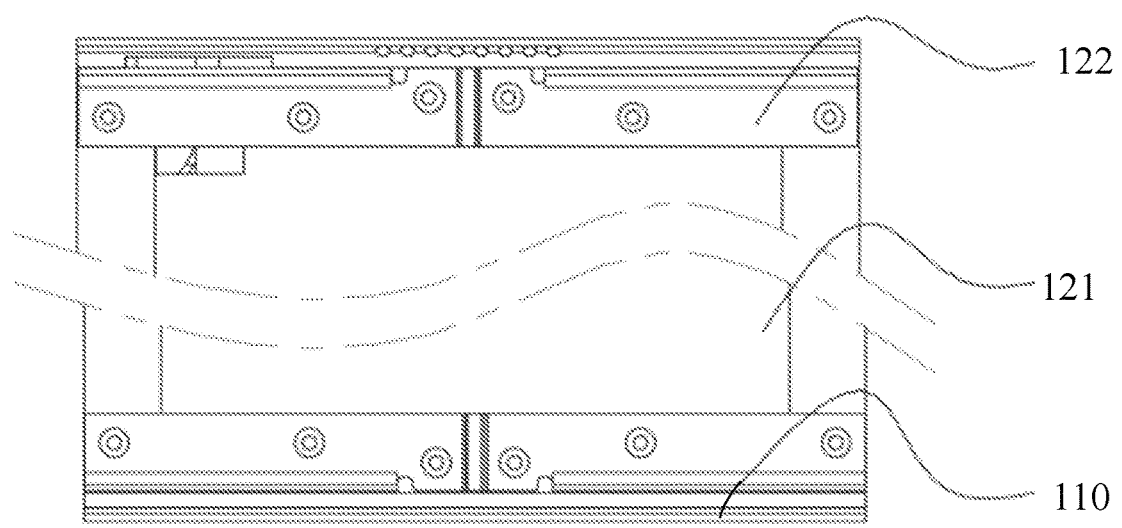
FIG. 17 shows a schematic diagram of fitting between a sliding rail assembly and a housing assembly according to an exemplary embodiment of the present disclosure.
Figure 18:
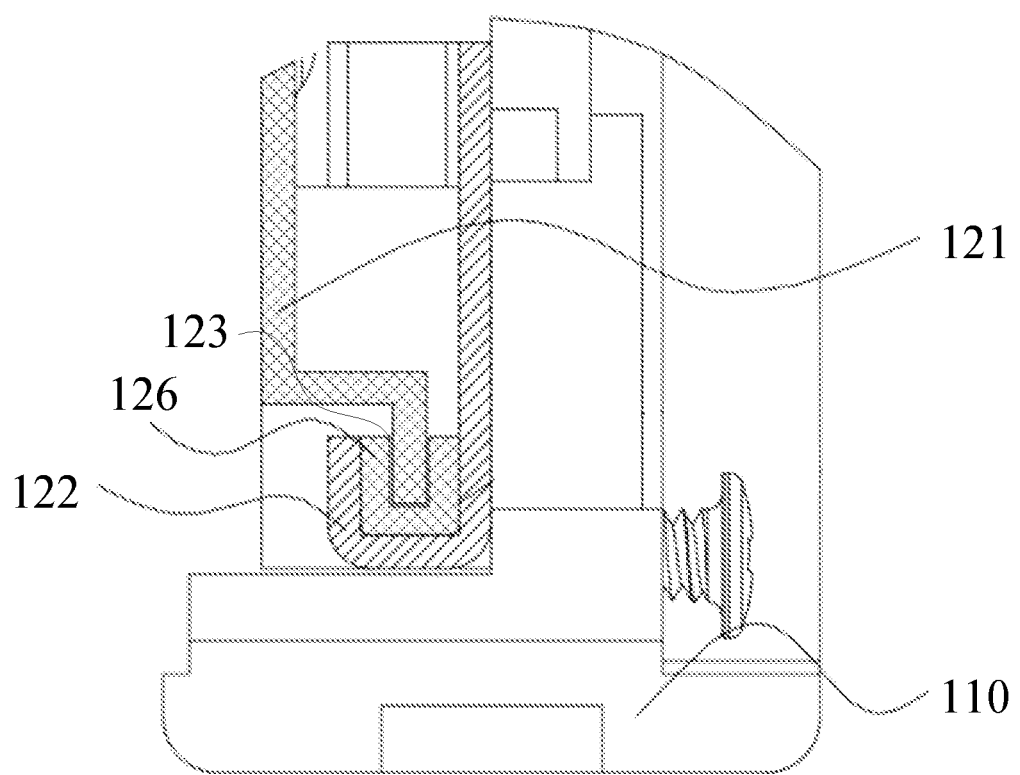
FIG. 18 shows a partial sectional view of fitting of a sliding rail assembly and a housing assembly according to an exemplary embodiment of the present disclosure.

FIG. 15 shows a schematic structural diagram of a sliding rail assembly 120 in a retracted state according to an exemplary embodiment of the present disclosure, FIG. 16 shows a schematic structural diagram of a sliding rail assembly 120 in an extended state according to an exemplary embodiment of the present disclosure, FIG. 17 shows a schematic diagram of fitting between a sliding rail assembly 120 and a housing assembly 110 according to an exemplary embodiment of the present disclosure, and FIG. 18 shows a partial sectional view of fitting of a sliding rail assembly 120 and a housing assembly 110 according to an exemplary embodiment of the present disclosure. In some embodiments, referring to FIGS. 15 to 18, the sliding rail assembly 120 further includes at least one fixing member 122 fixed to the housing assembly 110 and provided with a second sliding groove 123, and the sliding rail 121 has an end slidably limited in the second sliding groove 123. The second sliding groove 123 provides sliding guidance for sliding of the sliding rail 121. In an example, the sliding rail assembly 120 includes a first sliding rail 124 and a second sliding rail 125 arranged oppositely as well as two fixing members 122 arranged oppositely, and the first and second sliding rails 124, 125 are limited between the two fixing members 122, may be slid towards each other to make the flexible screen 170 in the retracted state, and may also be slid away each other to make the flexible screen 170 in the extended state.

In an example, with continued reference to FIG. 18, the second sliding groove 123 includes a first lubrication layer 126 forming an inner wall of the second sliding groove 123. Thus, the sliding rail 121 is facilitated to slide smoothly in the second sliding groove 123 of the fixing member 122. In an example, the groove of the fixing member 122 may be formed by stamping stainless steel, a material of the first lubrication layer 126 includes polyoxymethylene (also called POM), and a lubrication effect is given to the inner wall of the second sliding groove 123 by injecting the polyoxymethylene into the groove to form the lubrication layer.

Further, in some embodiments, with continued reference to FIGS. 15 and 16, the sliding rail assembly 120 further includes a buffer limiting member 127 provided at the fixing member 122 and configured to abut against the sliding rail 121 sliding from the outside to the housing assembly 110, thus limiting a maximum stroke of the sliding rail 121 sliding towards the housing assembly 110. The buffer limiting member 127 may include a plastic member which not only limits the sliding rail 121, but also enables the sliding rail 121 and the buffer limiting member 127 to stably abut against each other without wearing the sliding rail 121. In an example, two buffer limiting members 127 may be provided to the fixing member 122, and arranged at a middle portion of the fixing member 122, and configured to abut against the first and second sliding rails 124, 125 respectively.

Figure 19:
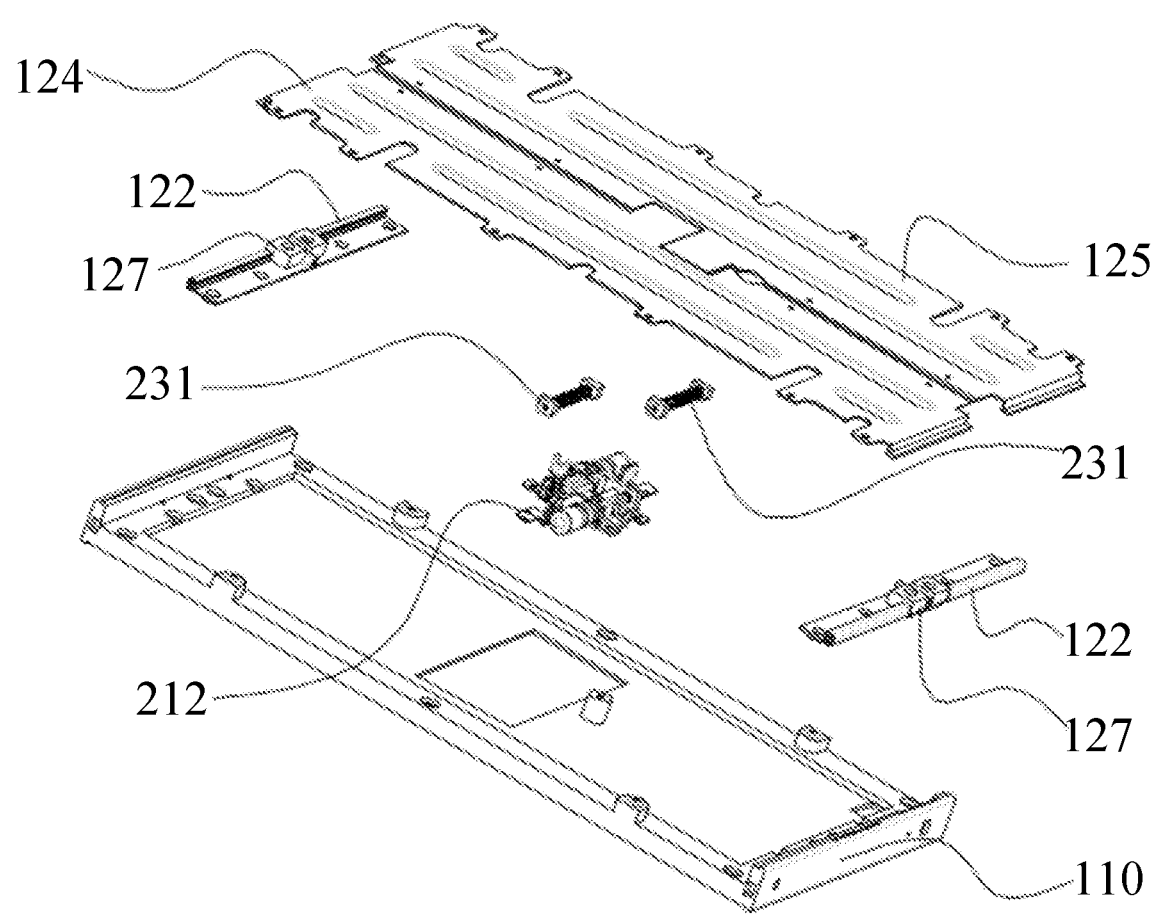
FIG. 19 shows a schematic exploded diagram of fitting among a sliding rail assembly, a housing assembly and a driving assembly according to an exemplary embodiment of the present disclosure.
Figure 20:
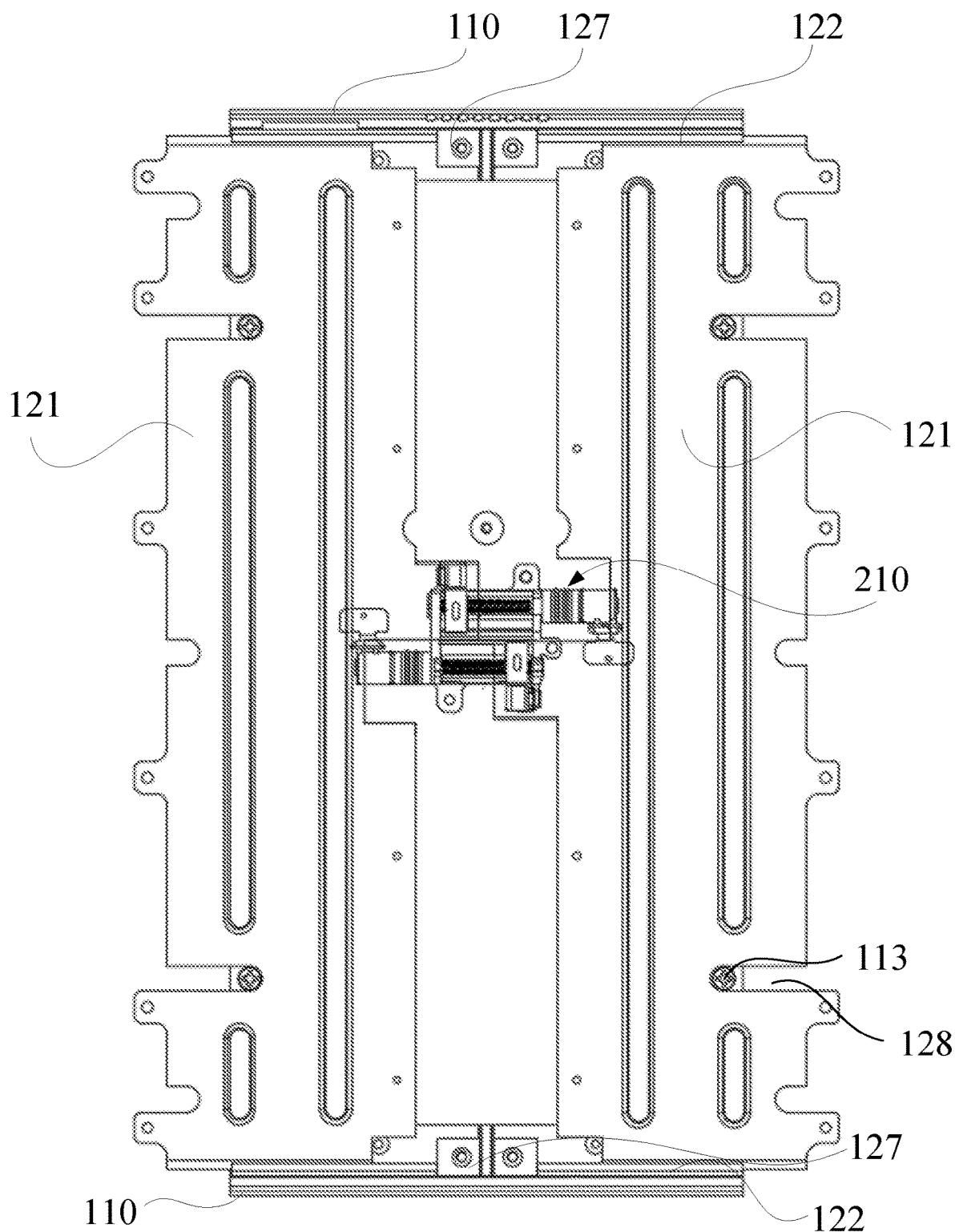
FIG. 20 shows a schematic diagram of fitting among a sliding rail assembly, a housing assembly and a driving assembly according to an exemplary embodiment of the present disclosure.

FIG. 19 shows a schematic exploded diagram of fitting among a sliding rail assembly 120, a housing assembly 110 and a driving assembly 210 according to an exemplary embodiment of the present disclosure, and FIG. 20 shows a schematic diagram of fitting among a sliding rail assembly 120, a housing assembly 110 and a driving assembly 210 according to an exemplary embodiment of the present disclosure. In some embodiments, with reference to FIGS. 19 to 21, an edge of the housing assembly 110 is provided with a limiting portion 113, and the sliding rail 121 is provided with a third limiting groove 128, and slid outwards from the housing assembly 110 to limit the limiting portion 113 in the third limiting groove 128. Thus, the maximum stroke of the sliding rail 121 sliding outwards from the housing assembly 110 is limited by the cooperation of the limiting portion 113 and the third limiting groove 128, and the sliding rail 121 is prevented from being separated from the housing assembly 110. The limiting portion 113 may have a protruding structure, or the limiting portion 113 is configured as a screw fixed to the housing component 110.

Figure 21:
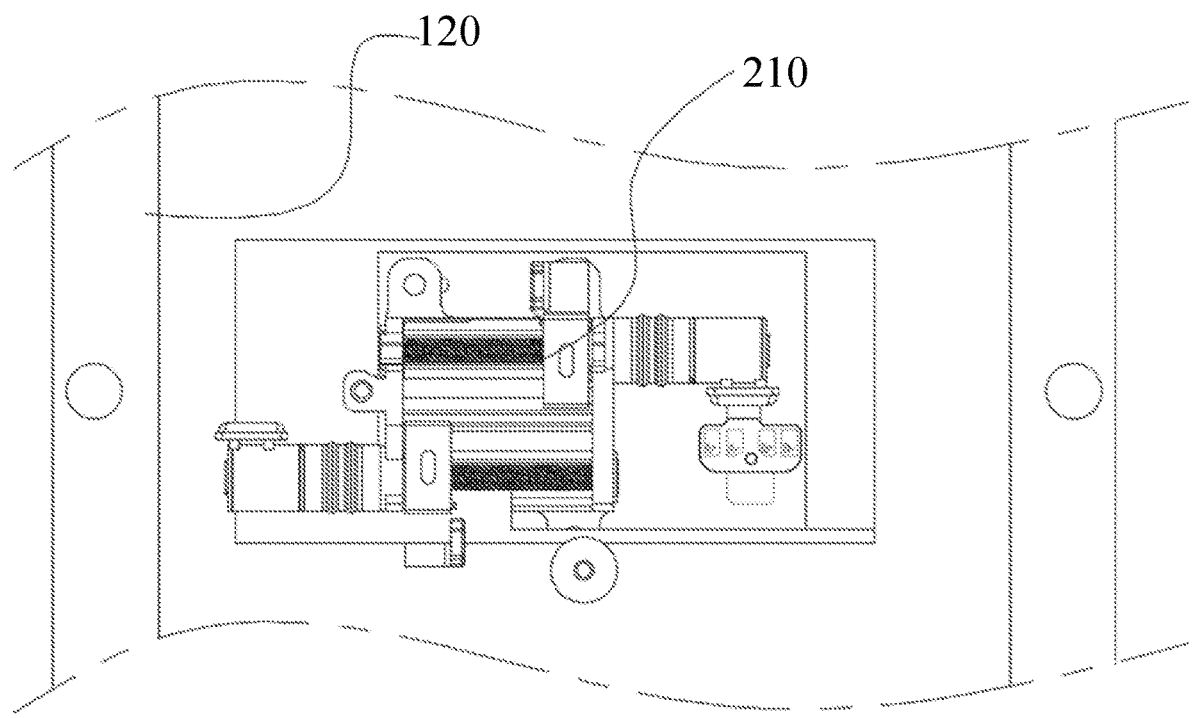
FIG. 21 shows a schematic diagram of fitting between a driving assembly and a housing assembly according to an exemplary embodiment of the present disclosure.

FIG. 21 shows a schematic diagram of fitting between a driving assembly 210 and a sliding rail assembly 120 according to an exemplary embodiment of the present disclosure. In some embodiments, referring to FIGS. 20 and 21, the electronic device further includes the driving assembly 210 assembled to the housing assembly 110, coupled to the sliding rail 121, and configured to drive the sliding rail 121 to slide. Thus, the sliding rail 121 may be automatically controlled to slide by the driving assembly 210, and may also be stably slid to any position in the maximum stroke, such that the flexible screen 170 may be extended into various sizes to improve the user experiences.

Figure 22:
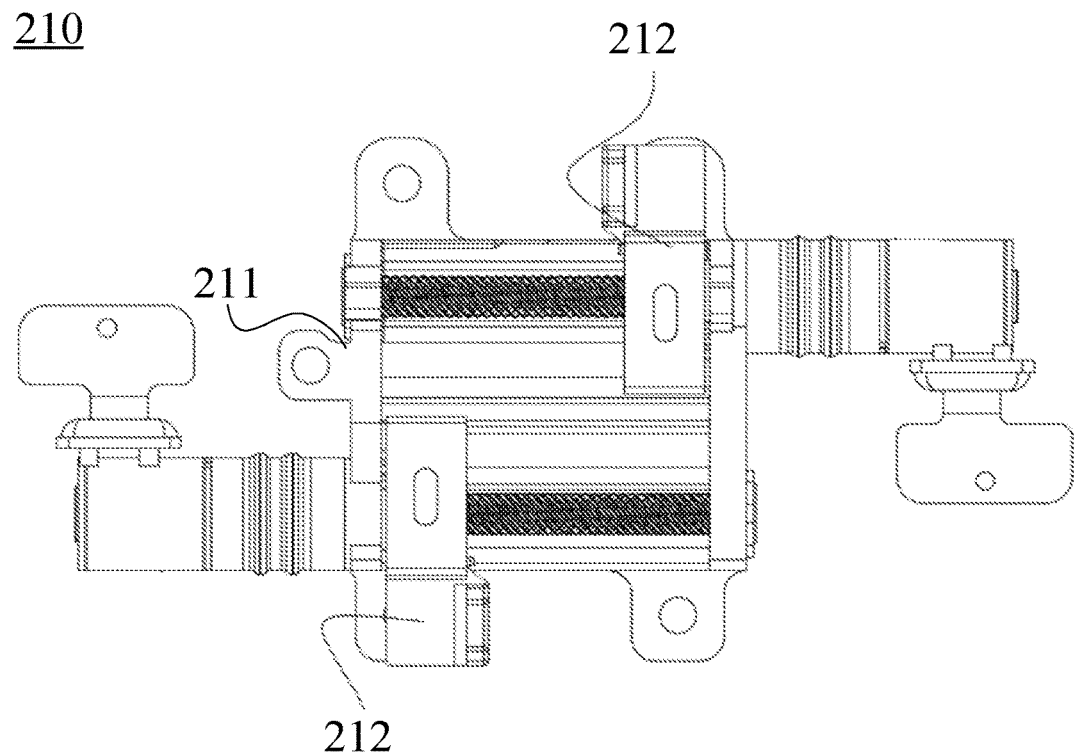
FIG. 22 shows a partial schematic structural diagram of a driving assembly according to an exemplary embodiment of the present disclosure.

FIG. 22 shows a partial schematic structural diagram of a driving assembly 210 according to an exemplary embodiment of the present disclosure. In some embodiments, referring to FIG. 22, the driving assembly 210 includes a driving assembly support 211 fixed to the housing assembly 110 and at least one driving unit 212 assembled to the driving assembly support 211 and configured to drive the sliding rail 121 to slide. By fixing the driving assembly support 211 to the housing assembly 110, the driving unit 212 assembled to the driving assembly support 211 stably drives the sliding rail 121 to slide.

The following two classes of embodiments of the structure of the driving assembly 210 are given in the present disclosure.

Figure 23:
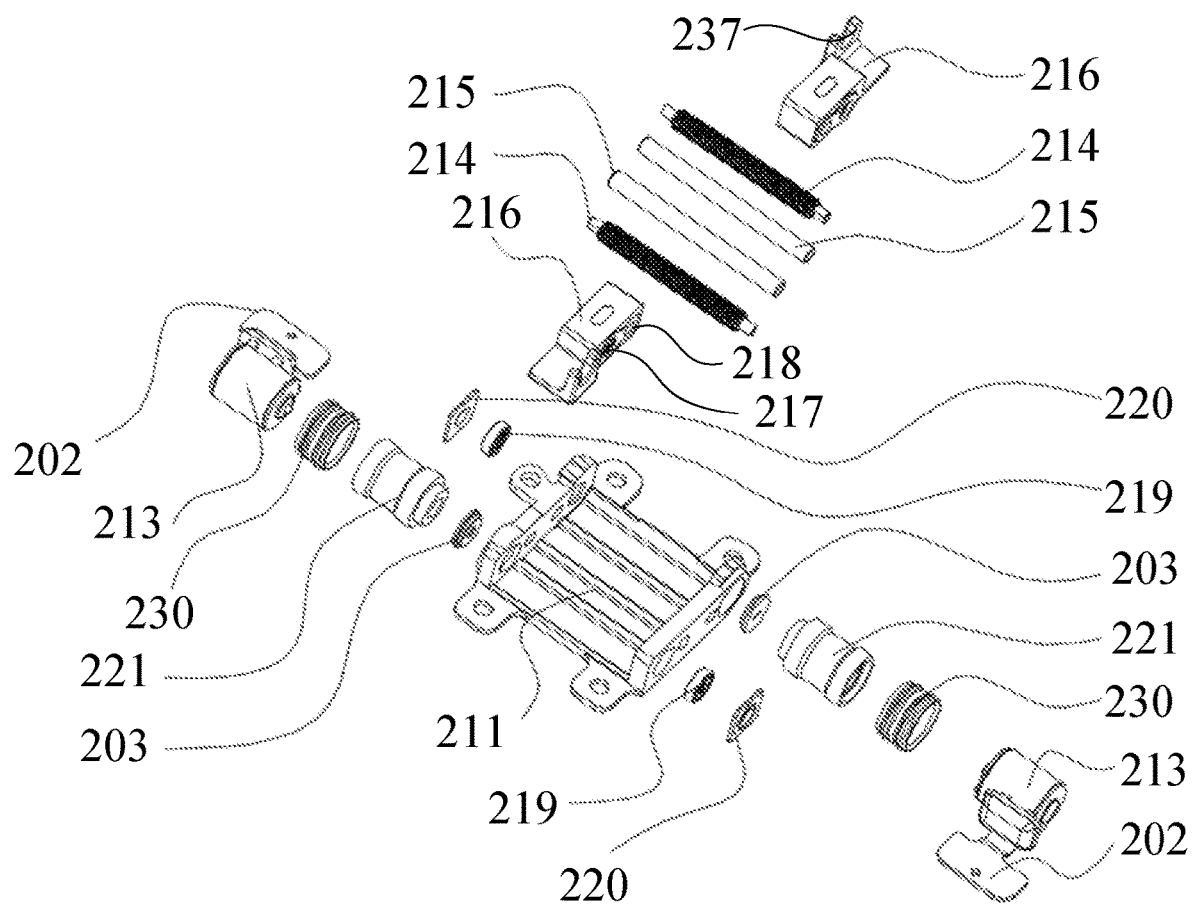
FIG. 23 shows a partial schematic exploded diagram of a driving assembly according to an exemplary embodiment of the present disclosure.

FIG. 23 shows a partial schematic exploded diagram of a driving assembly 210 according to an exemplary embodiment of the present disclosure. In the first class of embodiments, referring to FIGS. 22 and 23, the driving unit 212 includes a first driving member 213, a first transmission lead screw 214, a first guide rod 215 and a first pushing member 216. The first transmission lead screw 214 and the first guide rod 215 are assembled to the driving assembly support 211, the first driving member 213 is coupled to an end of the first transmission lead screw 214, and the first driving member 213 is configured to drive the first transmission lead screw 214 to rotate. The first pushing member 216 is provided with a first transmission hole 217 and a first sliding hole 218, the first transmission hole 217 is drivingly coupled to the first transmission lead screw 214, the first sliding hole 218 is slidably fitted over the first guide rod 215, and the first pushing member 216 is configured to push the sliding rail 121 to slide. When the first driving member 213 drives the first transmission lead screw 214 to rotate, the rotating first transmission lead screw 214 drives the first pushing member 216 to move linearly along an axial direction of the first transmission lead screw 214, the first guide rod 215 provides guidance for the first pushing member 216 to ensure that the first pushing member 216 is moved stably, and the first pushing member 216 drives the sliding rail 121 to slide. It may be understood that an inner wall of the first transmission hole 217 is provided with a transmission thread fitted with the first transmission lead screw 214 to achieve linear movement under the driving action of the first transmission lead screw 214. In an example, the first pushing member 216 may employ powder metallurgy and plastic double-shot molding processes, and the plastic may be polyoxymethylene (also called POM), and is formed at the inner wall of the first transmission hole 217 for lubrication, thus facilitating transmission between the first transmission hole 217 and the first transmission lead screw 214.

In an example, the first driving member 213 includes a stepping motor. The stepping motor is configured as an open-loop control stepping motor which converts an electrical pulse signal into angular displacement or linear displacement. Under a non-overload condition, a rotating speed and a stopping position of the stepping motor only depend on a frequency and a pulse number of the pulse signal and are not influenced by a load change. When a control chip of the stepping motor receives one pulse signal, the stepping motor is driven to be rotated by a fixed angle in a set direction, and a driving shaft of the stepping motor is rotated step by step by the fixed angle. The angular displacement may be controlled by controlling the number of the pulses, so as to achieve a purpose of accurate positioning. The rotating speed and acceleration of the stepping motor may be controlled by controlling the pulse frequency, so as to achieve purposes of speed regulation and rotating torque output. The first driving member 213 may be coupled to a flexible circuit board 202, and the flexible circuit board 202 may be provided with a driving chip to control and drive the first driving member to work.

In an example, with continued reference to FIG. 23, an end of the first transmission lead screw 214 may be fitted in a first bearing 219, and the first bearing 219 is assembled to the driving assembly support 211 by a first bearing pressing plate 220, such that the first transmission lead screw 214 may be rotated. The first bearing pressing plate 220 is configured to press the first bearing 219, and when not fixed by spot welding, the first bearing 219 may be pressed by the first bearing pressing plate 220 which may be fixed on the driving assembly support 211 by spot welding. The first bearing pressing plate 220 may be made of stainless steel.

In some embodiments, with continued reference to FIG. 23, the driving unit 212 further includes a first reduction gearbox 221 having a first end coupled to the first transmission lead screw 214, and a second end coupled to the first driving member 213. The first reduction gearbox 221 may amplify torque of the first driving member 213 to drive the first transmission lead screw 214 to rotate, thereby causing the first pushing member 216 to move linearly on the first transmission lead screw 214. The first reduction gearbox 221 may be coupled to the first transmission lead screw 214 by a first lead screw bushing 203.

Figure 24:
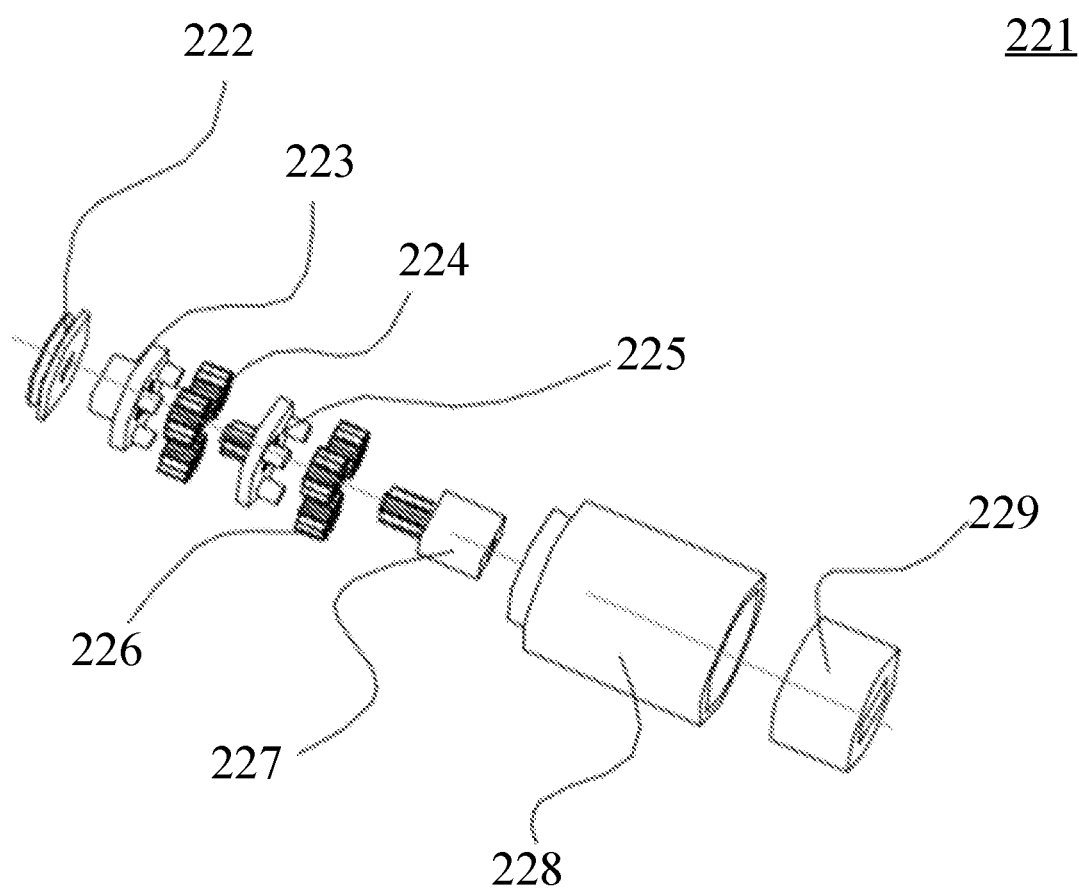
FIG. 24 shows an exploded view of a first reduction gearbox according to an exemplary embodiment of the present disclosure.

FIG. 24 shows an exploded view of a first reduction gearbox 221 according to an exemplary embodiment of the present disclosure. In some embodiments, referring to FIG. 24, the first reduction gearbox 221 includes a second lead screw bushing 222, a secondary gear carrier 223, a secondary planetary gear 224, a primary gear carrier 225, a primary planetary gear 226, a motor gear 227, a gear fixing ring 228 and a motor gear bushing 229. The secondary planetary gear 224 is assembled to the secondary gear carrier 223, the primary planetary gear 226 is assembled to the primary gear carrier 225, and the primary gear carrier 225, the secondary gear carrier 223 and the motor gear 227 are all assembled in the gear fixing ring 228. The motor gear 227 is fixedly coupled to an output shaft of the first driving member 213, the secondary gear carrier 223 is fixed to the first transmission lead screw 214, the torque of the first driving member 213 is reduced by the two-stage planetary gears, and a torque which is several times or dozens of times larger than the torque of the first driving member 213 is output to the first transmission lead screw 214 to drive the first transmission lead screw 214 to rotate.

In some embodiments, with continued reference to FIG. 23, the driving unit 212 further includes a first shock absorption member 230 fitted over an outer surface of the first reduction gearbox 221 to absorb abnormal noises and shocks. In an example, the first shock absorption member 230 is molded by injecting a soft rubber material.

Figure 25:
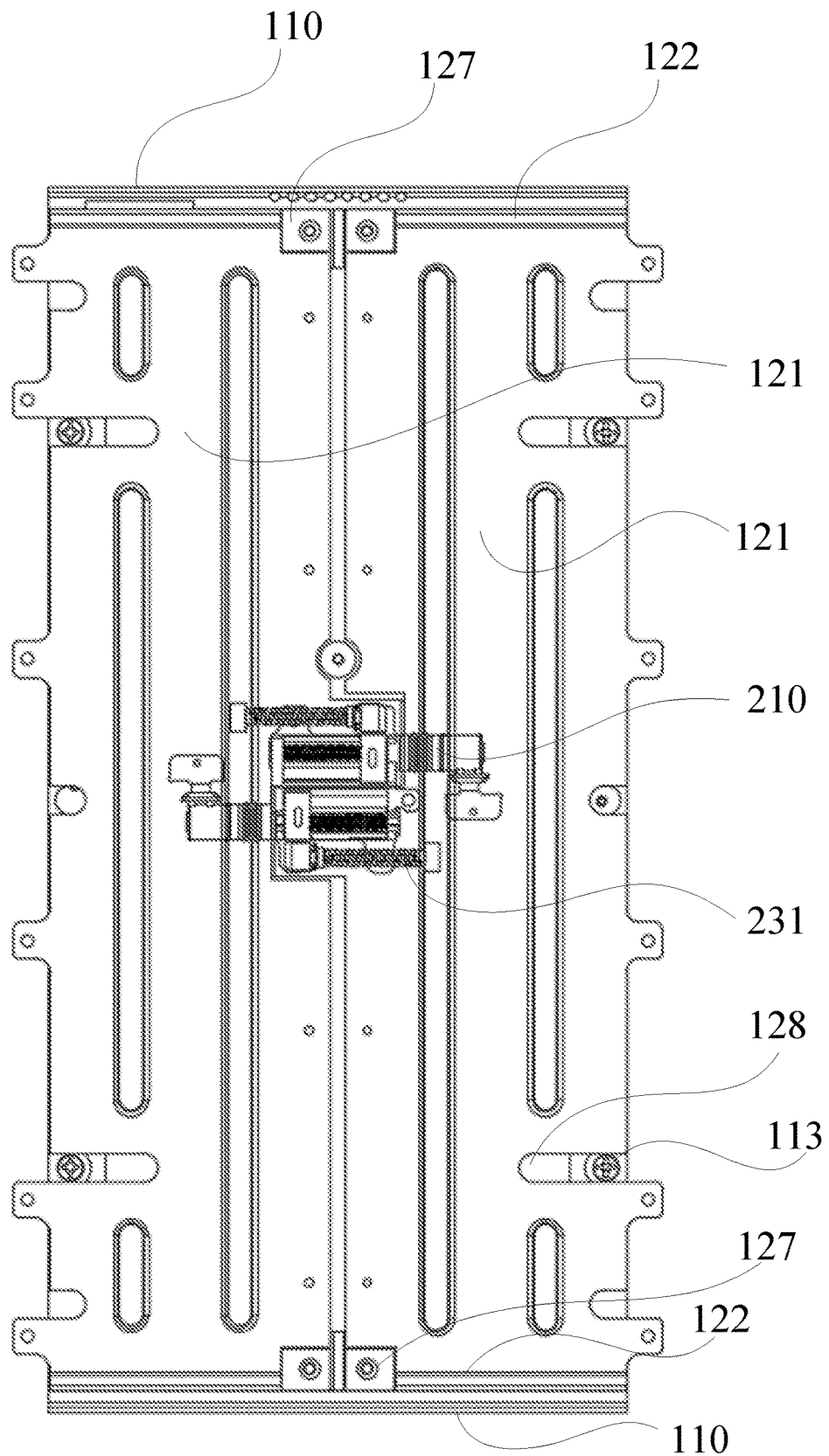
FIG. 25 shows a schematic diagram in which a sliding rail assembly and a driving assembly are assembled to a housing assembly according to an exemplary embodiment of the present disclosure.
Figure 26:
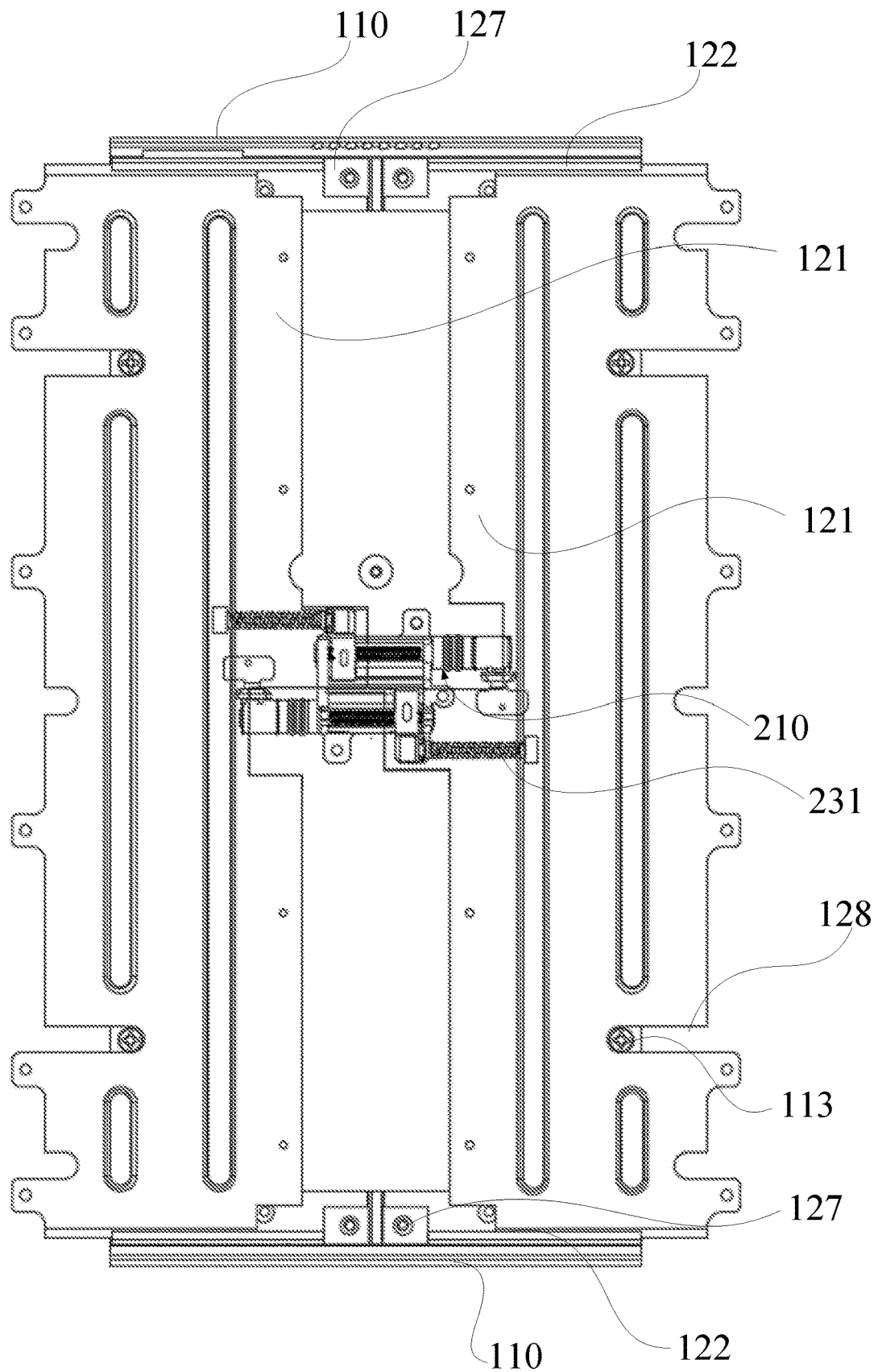
FIG. 26 shows a schematic diagram in which a sliding rail assembly and a driving assembly are assembled to a housing assembly according to an exemplary embodiment of the present disclosure.
Figure 27:
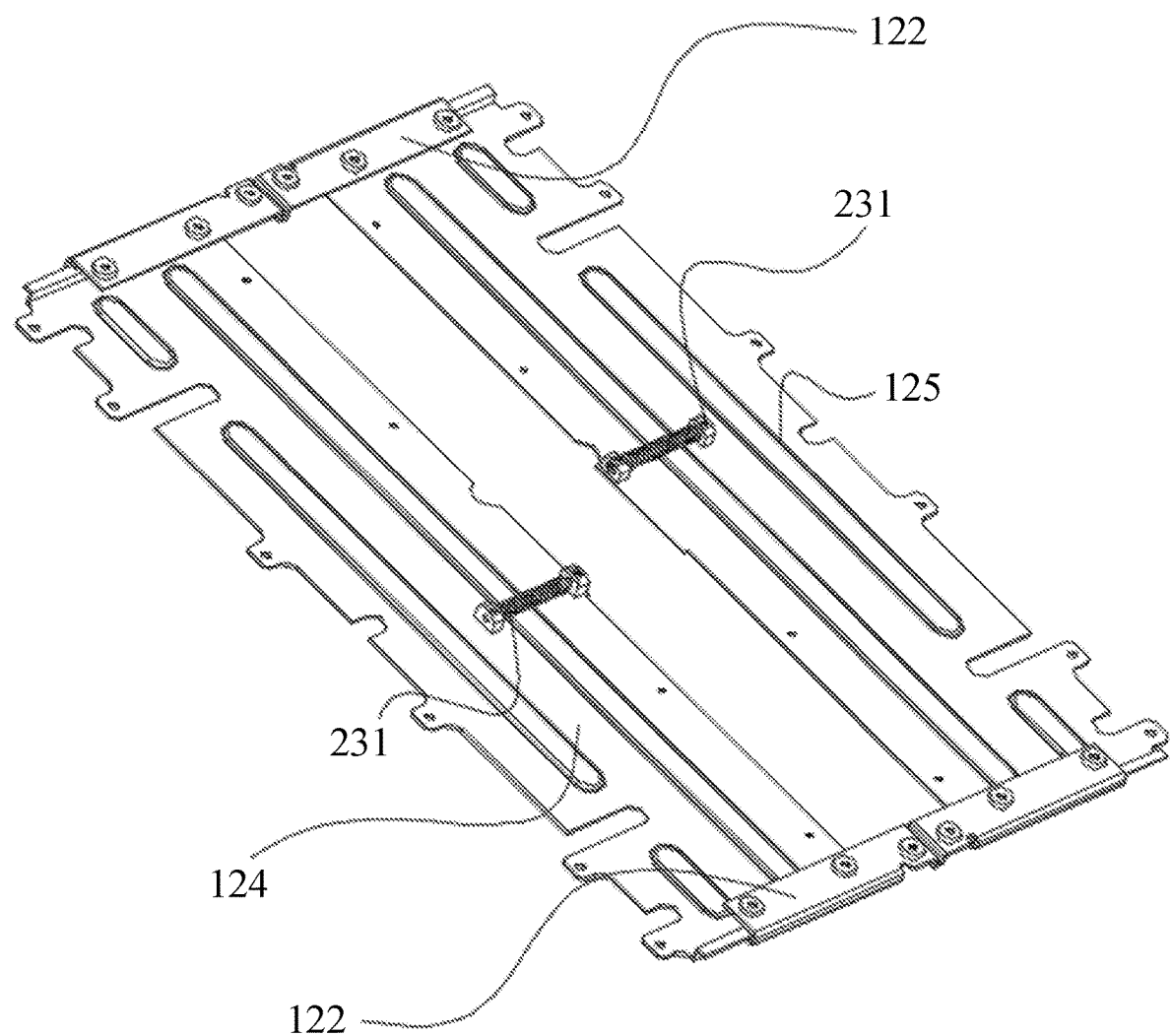
FIG. 27 shows a schematic diagram of fitting between an elastic buffer assembly and a sliding rail according to an exemplary embodiment of the present disclosure.
Figure 28:
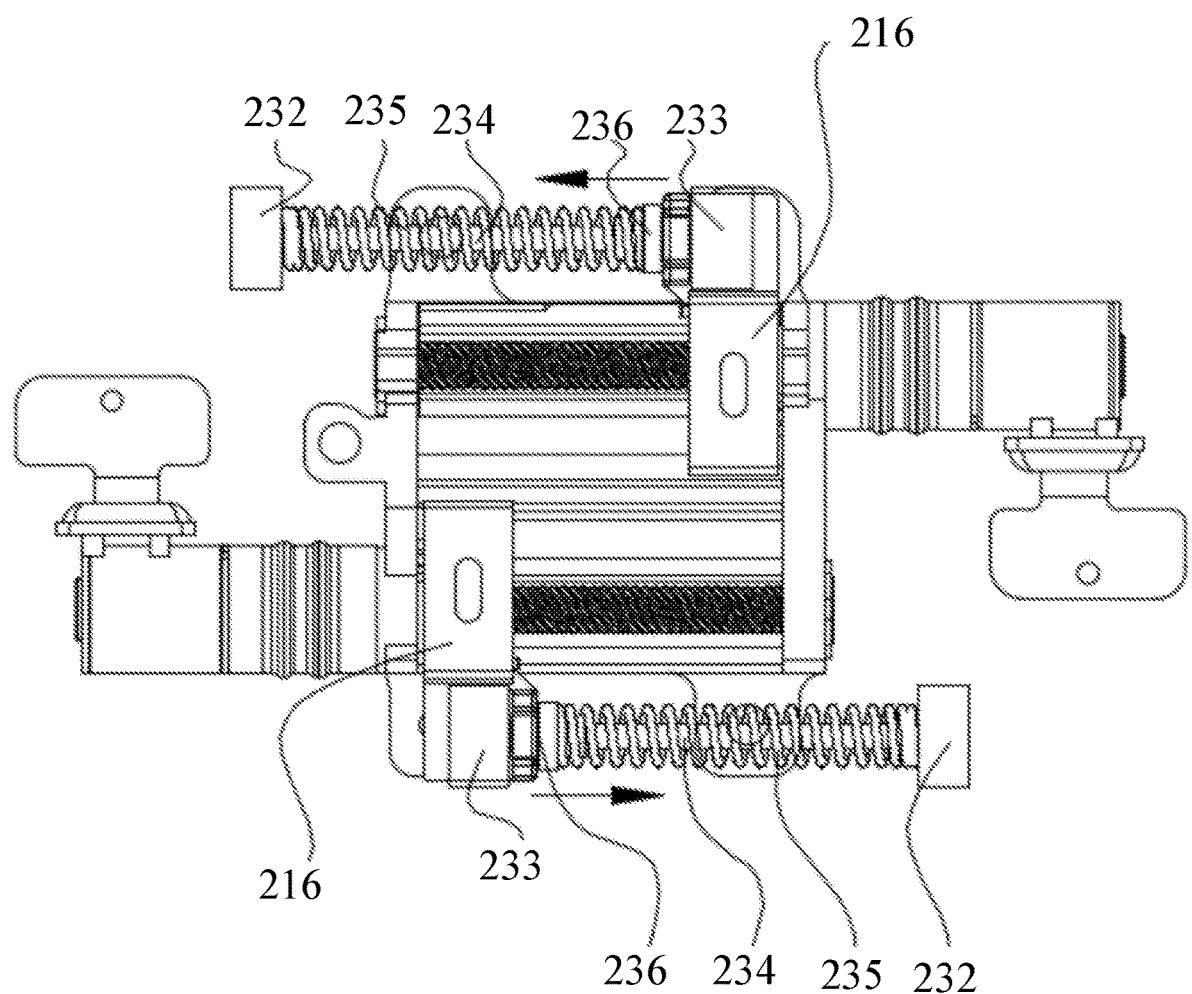
FIG. 28 shows a schematic structural diagram of a driving assembly according to an exemplary embodiment of the present disclosure.

FIG. 25 shows a schematic diagram in which a sliding rail assembly 120 and a driving assembly 210 are assembled to a housing assembly 110 according to an exemplary embodiment of the present disclosure, FIG. 26 shows a schematic diagram in which a sliding rail assembly 120 and a driving assembly 210 are assembled to a housing assembly 110 according to an exemplary embodiment of the present disclosure, FIG. 27 shows a schematic diagram of fitting between an elastic buffer assembly 231 and a sliding rail 121 according to an exemplary embodiment of the present disclosure, and FIG. 28 shows a schematic structural diagram of a driving assembly 210 according to an exemplary embodiment of the present disclosure. In some embodiments, with reference to FIGS. 25 to 28, the driving assembly 210 further includes at least one elastic buffer assembly 231 fixed to the sliding rail 121 and coupled to the driving unit 212. The elastic buffer assembly 231 has a buffer effect, and the driving unit 212 pushes the elastic buffer assembly 231 to enable the sliding rail 121 to stably slide.

In some embodiments, with continued reference to FIG. 28, the elastic buffer assembly 231 includes a first fixed portion 232, a second fixed portion 233, a third guide rod 234, and a second elastic member 235. The first and second fixed portions 232, 233 are fixed to the sliding rail 121, the third guide rod 234 is fixed between the first and second fixed portions 232, 233, the second elastic member 235 is fitted over the third guide rod 234, and the driving unit 212 pushes the second elastic member 235 to extend and retract on the third guide rod 234. Thus, the driving unit 212 pushes the second elastic member 235 to extend and retract on the third guide rod 234, such that the second elastic member 235 applies an acting force to the first or second fixed portion 232, 233, thereby stably pushing the sliding rail 121 to slide. In an example, a first end of the third guide rod 234 is fixed to the first fixed portion 232 by a thread, and a second end of the third guide rod 234 abuts against the second fixed portion 233, so as to facilitate assembly and disassembly of the elastic buffer assembly 231 and the sliding rail 121. In addition, the first end of the third guide rod 234 may be welded to the first fixed portion 232, and the second end may be welded to the second fixed portion 233.

In some embodiments, with continued reference to FIG. 28, the elastic buffer assembly 231 further includes a guide sleeve 236 slidably fitted over the third guide rod 234 and coupled to an end of the second elastic member 235 and the driving unit 212. The driving unit 212 pushes the guide sleeve 236, such that the guide sleeve 236 drives the second elastic member 235 to slidably extend and retract on the third guide rod 234, so as to stably push the sliding rail 121 to slide. In an example, with continued reference to FIG. 23, the first pushing member 216 of the driving unit 212 is provided with a first slot 237 engaged with the guide sleeve 236, and the guide sleeve 236 is driven to slidably extend and retract on the third guide rod 234 by the first pushing member 216.

In the first class of embodiments, two driving units 212 may be provided and drive the two sliding rails 121 to extend or retract respectively.

Figure 29:
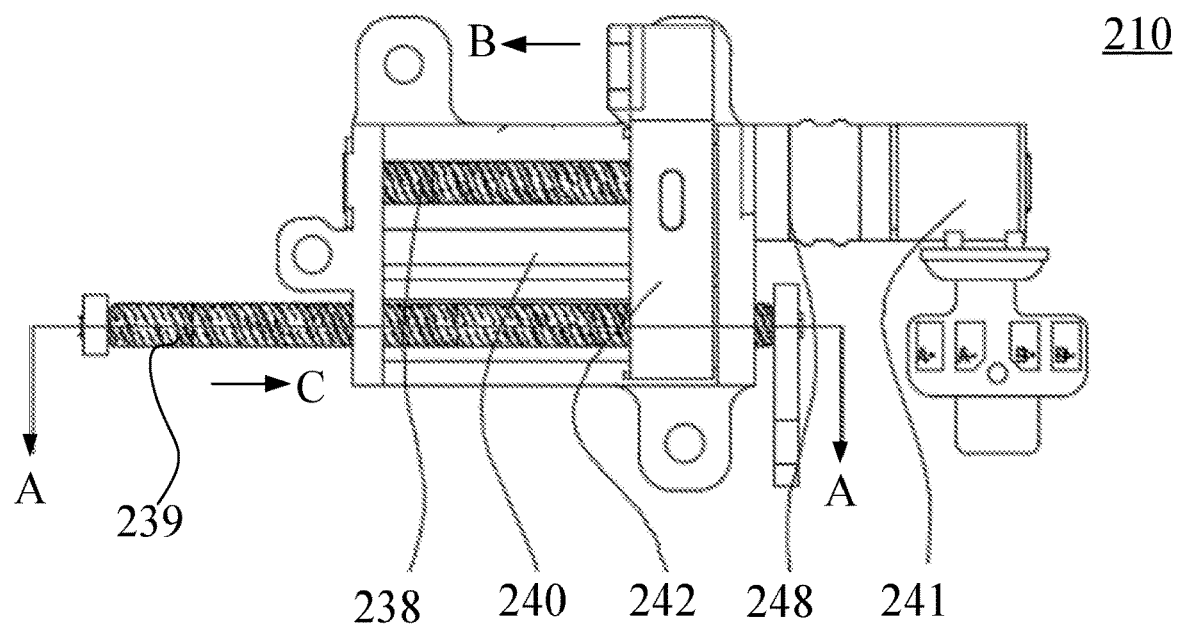
FIG. 29 shows a partial schematic structural diagram of a driving assembly according to an exemplary embodiment of the present disclosure.
Figure 30:
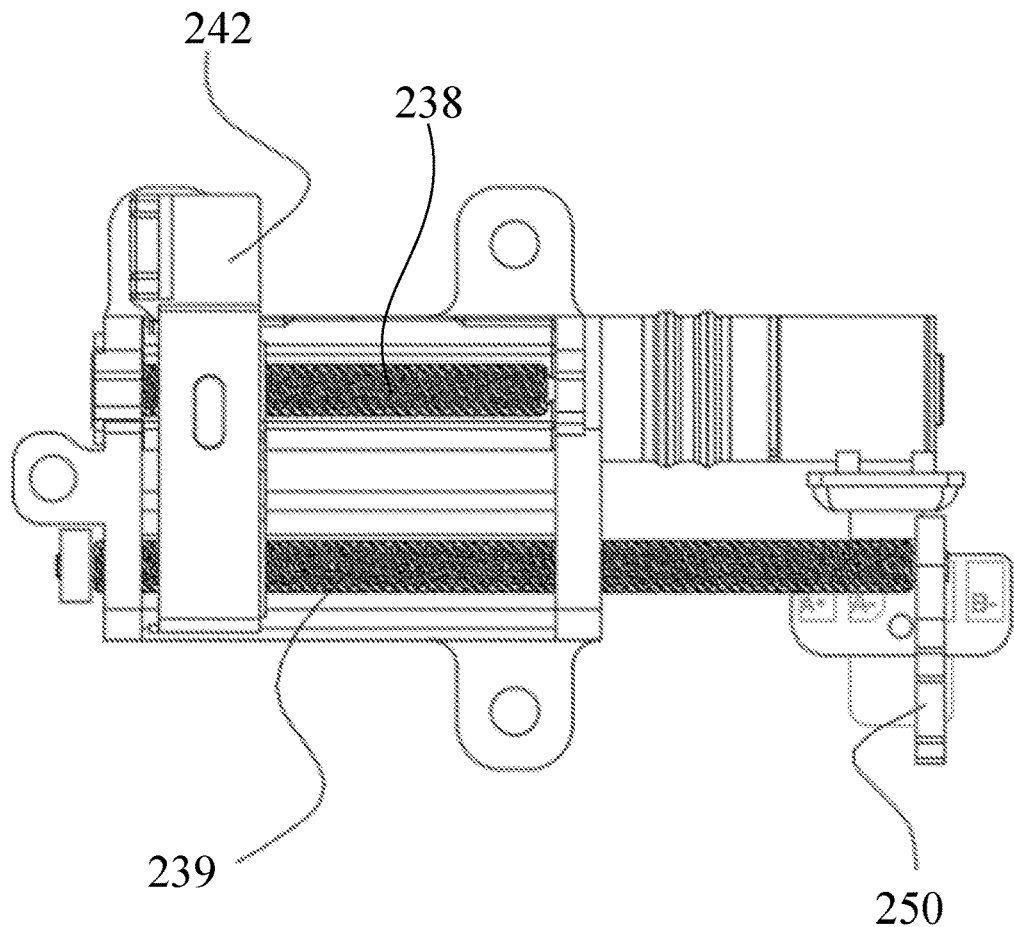
FIG. 30 shows a partial schematic structural diagram of a driving assembly according to an exemplary embodiment of the present disclosure.
Figure 31:
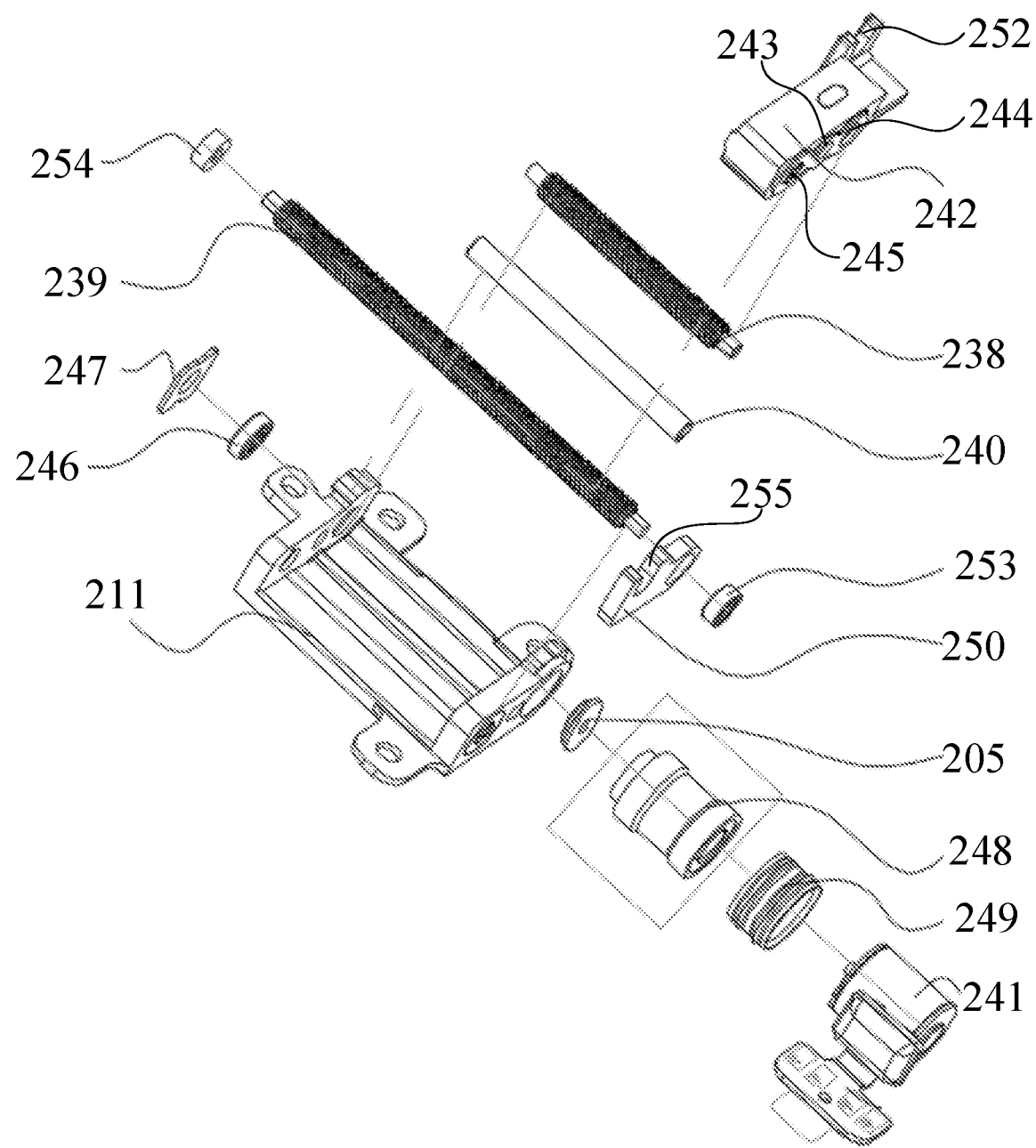
FIG. 31 shows a schematic exploded diagram of a driving assembly according to an exemplary embodiment of the present disclosure.

FIG. 29 shows a partial schematic structural diagram of a driving assembly 210 according to an exemplary embodiment of the present disclosure, FIG. 30 shows a partial schematic structural diagram of a driving assembly 210 according to an exemplary embodiment of the present disclosure, and FIG. 31 shows a schematic exploded diagram of a driving assembly 210 according to an exemplary embodiment of the present disclosure. In the second class of embodiments, with reference to FIGS. 29 to 31, at least two sliding rails 121 are provided. The driving unit 212 includes a second transmission lead screw 238, a third transmission lead screw 239, a second guide rod 240, a second driving member 241 and a second pushing member 242. The second transmission lead screw 238 and the second guide rod 240 are assembled to the driving assembly support 211, the third transmission lead screw 239 is axially movably assembled to the driving assembly support 211, and the second driving member 241 is configured to drive the second transmission lead screw 238 to rotate. The second pushing member 242 is provided with a second sliding hole 243, a second transmission hole 244 and a third transmission hole 245. The second sliding hole 243 is slidably fitted over the second guide rod 240, the second transmission hole 244 is drivingly coupled to the second transmission lead screw 238, and the third transmission hole 245 is drivingly coupled to the third transmission lead screw 239. The third transmission lead screw 239 and the second pushing member 242 have opposite moving directions, the second pushing member 242 is configured to drive one sliding rail 121 to slide, and the third transmission lead screw 239 is configured to drive the other sliding rail 121 to slide. For convenience of description, the sliding rail 121 driven by the second pushing member 242 is referred to as the first sliding rail 124, and the sliding rail 121 driven by the third transmission lead screw 239 is referred to as the second sliding rail 125. When the second driving member 241 drives the second transmission lead screw 238 to rotate, the rotating second transmission lead screw 238 drives the second pushing member 242 to move linearly along an axial direction of the second transmission lead screw 238, the second guide rod 240 provides guidance for the second pushing member 242 to ensure that the second pushing member 242 is moved stably, and the second pushing member 242 drives the first sliding rail 124 to slide. Meanwhile, the second pushing member 242 drives the third transmission lead screw 239 to move in a direction opposite to the moving direction of the second pushing member 242, and the third transmission lead screw 239 drives the second sliding rail 125 to move. It may be understood that, referring to FIG. 29, when the second pushing member 242 is moved in direction B, the third transmission lead screw 239 is moved in direction C, such that the second pushing member 242 and the third transmission lead screw 239 are in the state shown in FIG. 30. Due to the opposite moving directions of the second pushing member 242 and the third transmission lead screw 239, the first and second sliding rails 124, 125 are slidably extended away from each other, or slidably retracted towards each other. An inner wall of the second transmission hole 244 is provided with a transmission thread fitted with the second transmission lead screw 238 to enable the second pushing member 242 to be linearly moved under the driving action of the second transmission lead screw 238. An inner wall of the third transmission hole 245 is provided with a transmission thread fitted with the third transmission lead screw 239, such that when the second pushing member 242 is moved linearly, the third transmission lead screw 239 is linearly moved opposite to the second pushing member 242. In an example, the second and third transmission holes 244, 245 may have opposite thread directions, such that the second pushing member 242 and the third transmission lead screw 239 have opposite moving directions. In an example, the second and third transmission lead screws 238, 239 as well as the second guide rod 240 have parallel axes.

In an example, with continued reference to FIG. 31, an end of the second transmission lead screw 238 may be fitted in a second bearing 246, and the second bearing 246 is assembled to the driving assembly support 211 by a second bearing pressing plate 247, such that the second transmission lead screw 238 may be rotated. The second bearing pressing plate 247 is mainly configured to press the second bearing 246, and when not fixed by spot welding, the second bearing 246 may be pressed by the second bearing pressing plate 247 which may be fixed on the driving assembly support 211 by spot welding. The second bearing pressing plate 247 may be made of stainless steel.

In some embodiments, with continued reference to FIG. 31, the driving unit 212 further includes a second reduction gearbox 248 having a first end coupled to the second transmission lead screw 238, and a second end coupled to the second driving member 241. The second reduction gearbox 248 may amplify torque of the second driving member 241 to drive the second transmission lead screw 238 to rotate, thereby causing the second pushing member 242 to move linearly on the second transmission lead screw 238. The second reduction gearbox 248 may have the same structure as the first reduction gearbox 221, and for the structure of the second reduction gearbox 248, reference may be made to the structure of the first reduction gearbox 221, and the structure is not repeated herein. In an example, the second reduction gearbox 248 is coupled to the second transmission lead screw 238 by a third lead screw bushing 205.

In some embodiments, with continued reference to FIG. 31, the driving unit 212 further includes a second shock absorption member 249 fitted over an outer surface of the second reduction gearbox 248 to absorb abnormal noises and shocks. In an example, the second shock absorption member 249 is molded by injecting a soft rubber material.

Figure 32:
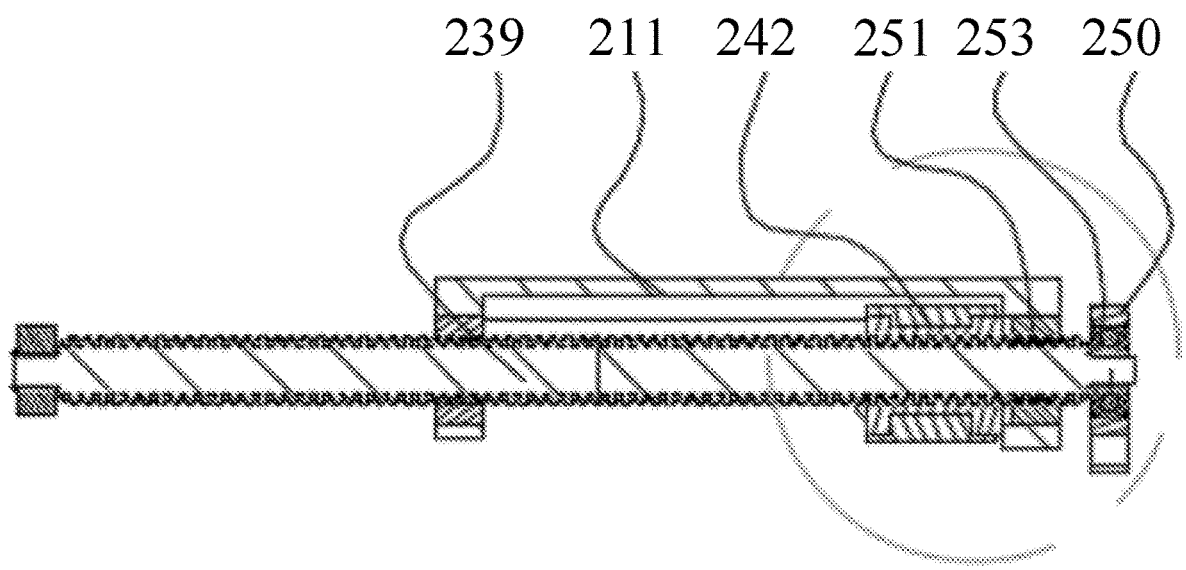
FIG. 32 shows a partial schematic structural diagram of a driving assembly according to an exemplary embodiment of the present disclosure.
Figure 33:
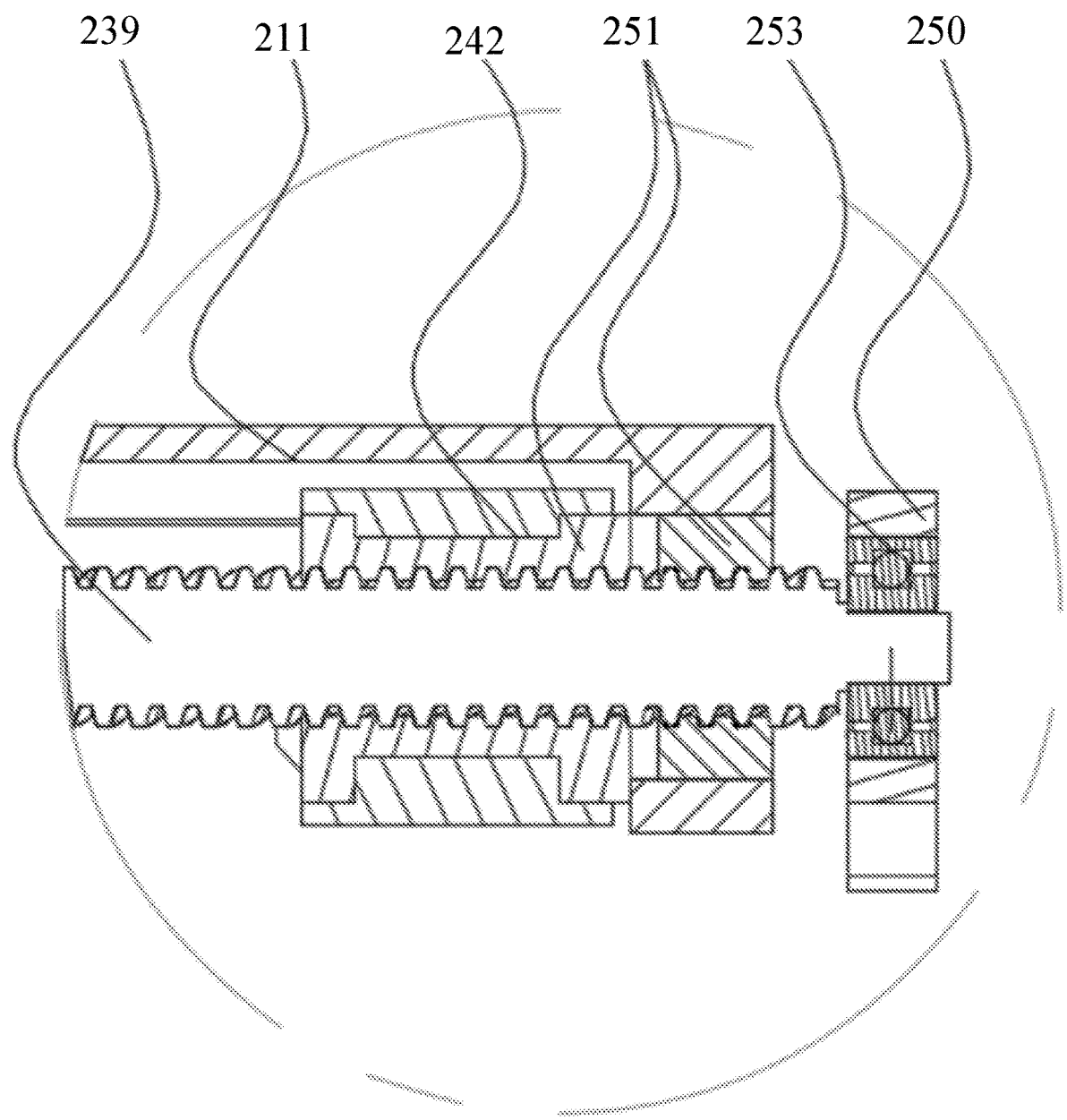
FIG. 33 shows a partial schematic enlarged diagram of the driving assembly in FIG. 32.

FIG. 32 shows a partial schematic structural diagram of a driving assembly 210 according to an exemplary embodiment of the present disclosure, and FIG. 33 shows a partial schematic enlarged diagram of the driving assembly 210 in FIG. 32. In some embodiments, referring to FIGS. 31, 32 and 33, the driving unit 212 further includes an adapter 250, an end of the third transmission lead screw 239 is rotatably coupled to the adapter 250, and the third transmission lead screw 239 drives the sliding rail 121 to slide by the adapter 250. In an example, the adapter 250 is fixedly provided with a third bearing 253, a first end of the third transmission lead screw 239 is rotatably coupled to the third bearing 253, and a second end of the third transmission lead screw 239 is provided with a limiting block 254. The driving assembly support 211 is provided with two opposite through holes, and after the third transmission lead screw 239 passes through the two through holes, the limiting block 254 and the adapter 250 cooperate to limit the third transmission lead screw 239. In an example, the third bearing 253 is welded to an end of the third transmission lead screw 239 and the adapter 250, such that the third transmission lead screw 239 may be rotated relative to the adapter 250. In an example, the inner wall of the third transmission hole 245 of the second pushing member 242 is formed by a second lubrication layer 251, and the second lubrication layer 251 may be made of polyoxymethylene (also called POM) to achieve a lubrication function, thus facilitating transmission between the third transmission hole 245 and the third transmission lead screw 239. The second pushing member 242 may employ powder metallurgy and plastic double-shot molding processes, and the inner wall of the second transmission hole 244 may also be made of polyoxymethylene (also called POM).

Figure 34:
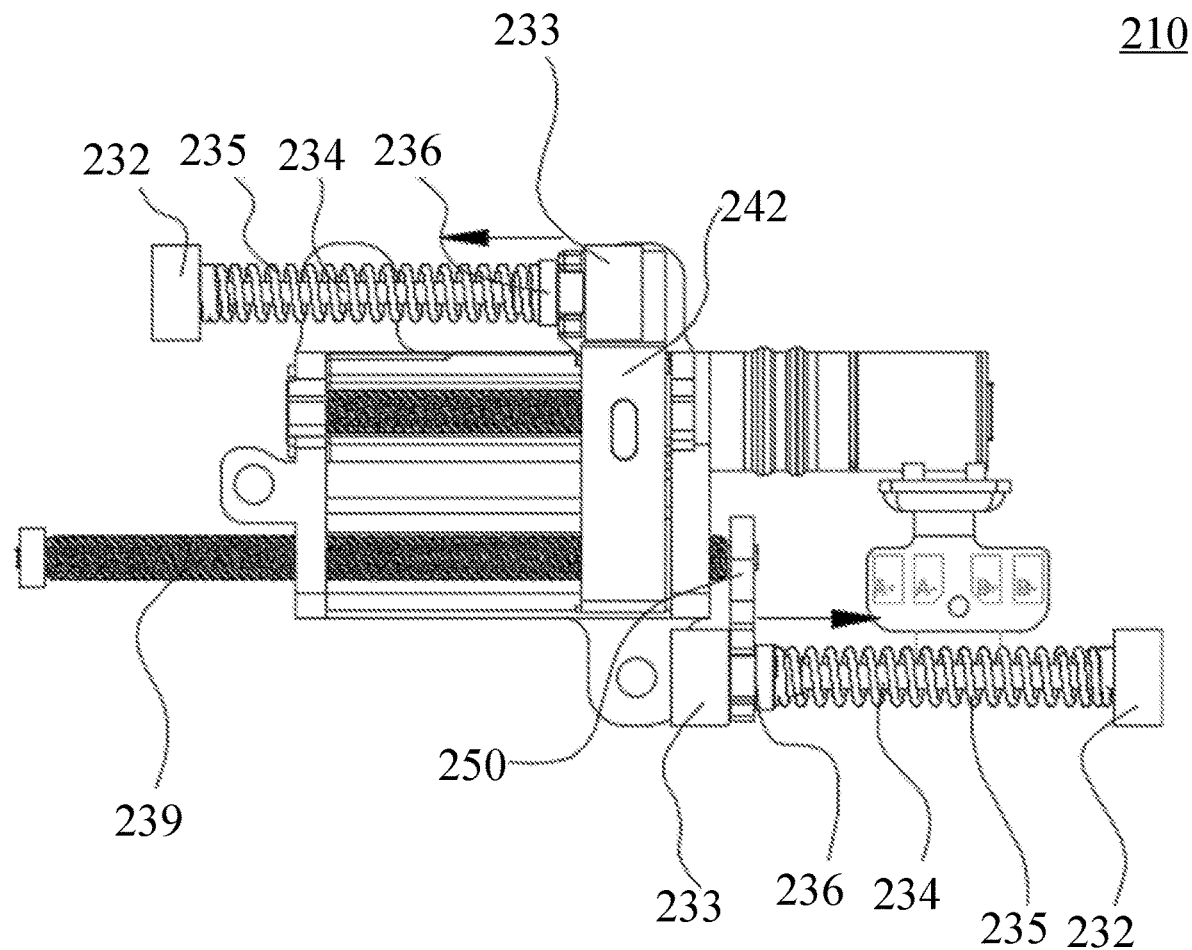
FIG. 34 shows a schematic structural diagram of a driving assembly according to an exemplary embodiment of the present disclosure.

FIG. 34 shows a schematic structural diagram of a driving assembly 210 according to an exemplary embodiment of the present disclosure. In some embodiments, with reference to FIGS. 31 and 34, the second pushing member 242 of the driving unit 212 is provided with a second slot 252 engaged with the guide sleeve 236, and the guide sleeve 236 provided at the first sliding rail 124 is driven to slidably extend and retract at the third guide rod 234 by the second pushing member 242. The adapter 250 may be provided with a third slot 255 which may be engaged with the guide sleeve 236, and the guide sleeve 236 provided at the second sliding rail 125 is driven to slidably extend and retract at the third guide rod 234 by the adapter 250.

In some embodiments, the electronic device further includes a controller (not shown) coupled to the driving unit 212 and configured to control the driving unit 212 to drive the sliding rail 121 to slide. In an example, the controller may include a CPU (Central Processing Unit) of the electronic device. In an example, the first driving member 213 (second driving member 241) is coupled to the flexible circuit board, and the flexible circuit board is provided with the driving chip, and coupled to the controller of the electronic device through an elastic piece or a BTB connector, such that the controller may control the first driving member 213 (second driving member 241) to work. In response to a tapping operation, the flexible screen 170 sends a first instruction to the controller, the controller sends a first driving instruction to the driving chip of the first driving member 213 (second driving member 241) according to the first instruction, and the driving chip controls the first driving member 213 (second driving member 241) to drive the first transmission lead screw 214 (second transmission lead screw 238) to rotate around a first direction based on the first driving instruction, such that the sliding rail 121 is extended. In response to a tapping operation, the flexible screen 170 sends a second instruction to the controller, the controller sends a second driving instruction to the driving chip of the first driving member 213 (second driving member 241) according to the second instruction, and the driving chip controls the first driving member 213 (second driving member 241) to drive the first transmission lead screw 214 (second transmission lead screw 238) to rotate around a second direction different from the first direction based on the second driving instruction, such that the sliding rail 121 is retracted.

Figure 35:
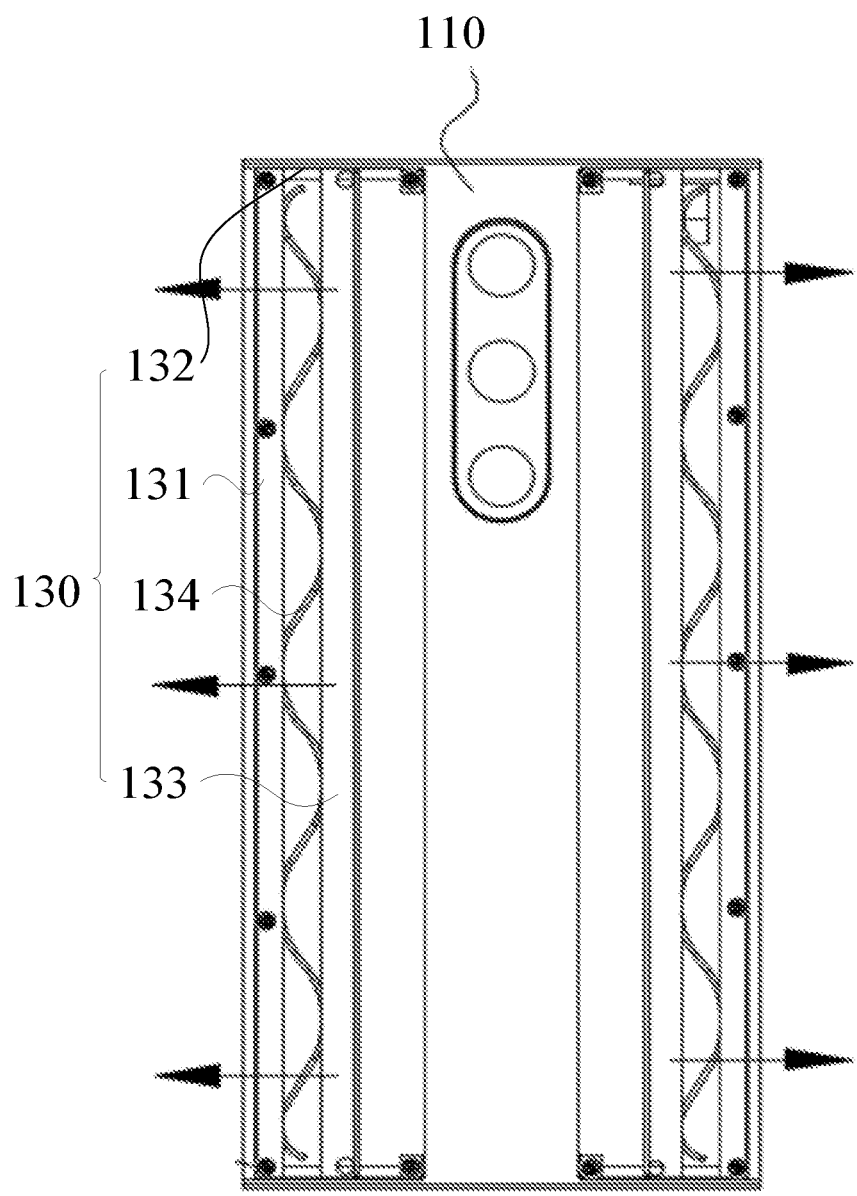
FIG. 35 shows a partial schematic structural diagram of an electronic device when a flexible screen is in a retracted state according to an exemplary embodiment of the present disclosure.
Figure 36:
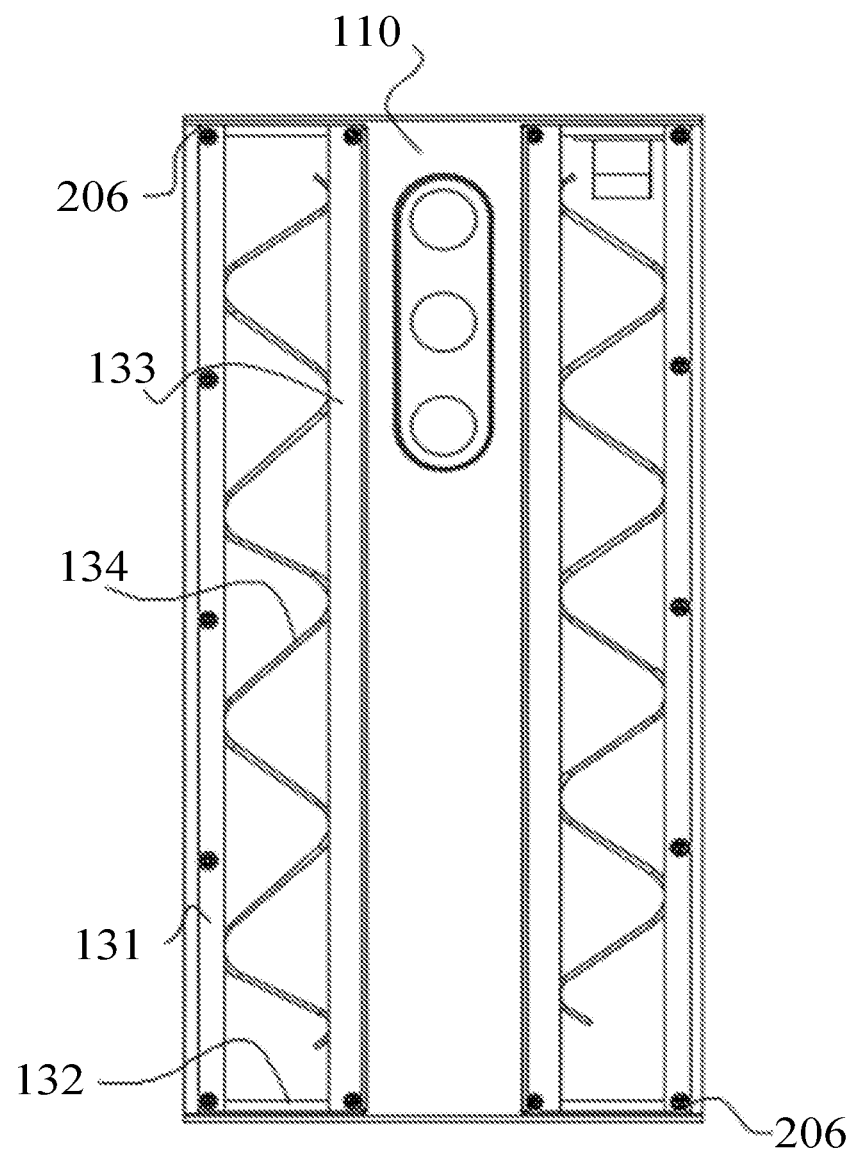
FIG. 36 shows a partial schematic structural diagram of an electronic device when a flexible screen is in a retracted state according to an exemplary embodiment of the present disclosure.
Figure 37:
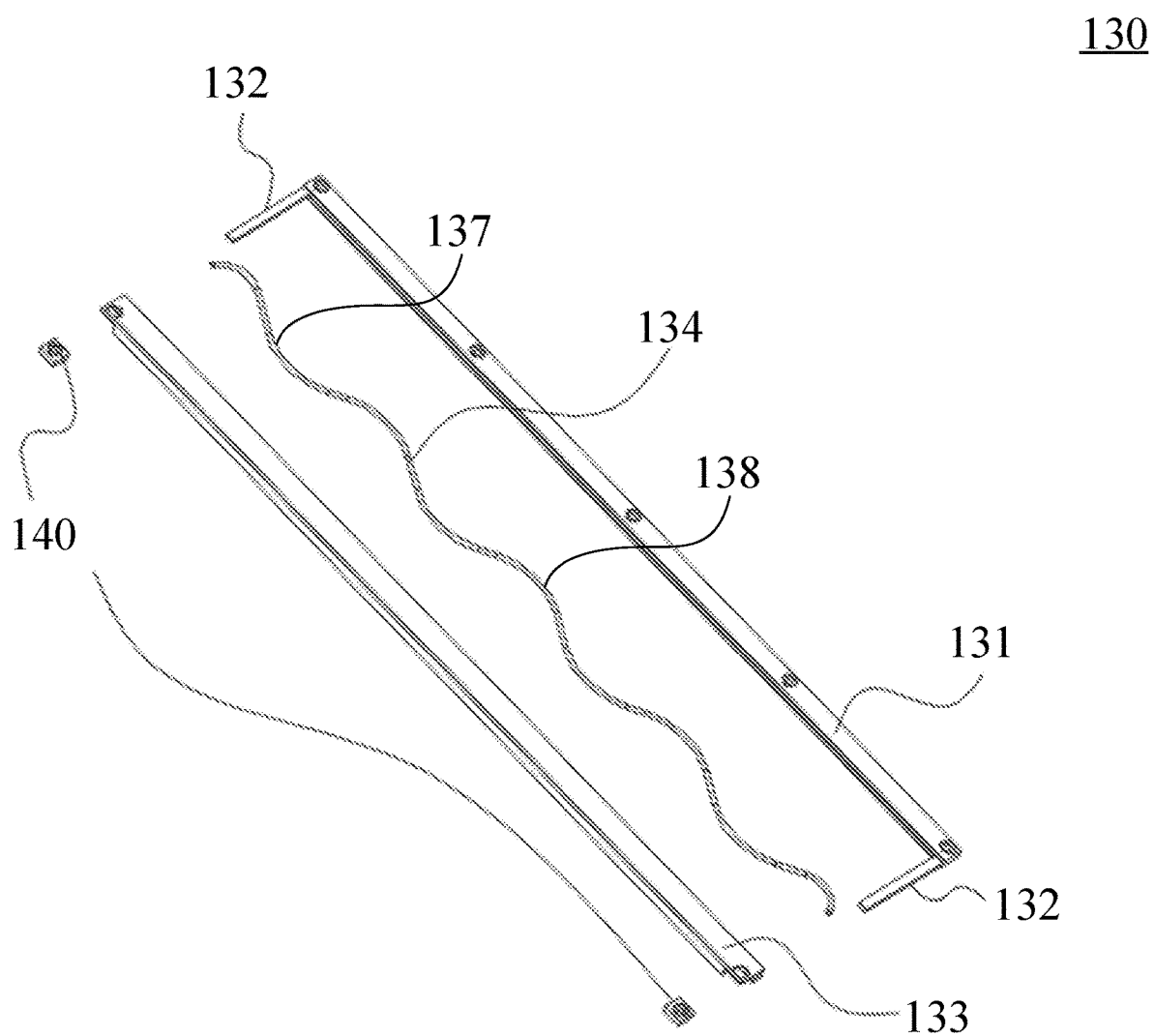
FIG. 37 shows a schematic exploded diagram of an elastic telescopic assembly according to an exemplary embodiment of the present disclosure.

FIG. 35 shows a partial schematic structural diagram of an electronic device when a flexible screen 170 is in a retracted state according to an exemplary embodiment of the present disclosure, FIG. 36 shows a partial schematic structural diagram of an electronic device when a flexible screen 170 is in a retracted state according to an exemplary embodiment of the present disclosure, and FIG. 37 shows a schematic exploded diagram of an elastic telescopic assembly 130 according to an exemplary embodiment of the present disclosure. In some embodiments, with reference to FIGS. 35 to 37, the elastic telescopic assembly 130 includes an elastic telescopic assembly support 131, a guide member 132, a sliding member 133, and a first elastic member 134. The elastic telescopic assembly support 131 is fixed to the housing assembly 110, and the sliding member 133 is coupled to the elastic telescopic assembly support 131, slidably coupled to the guide member 132, coupled to the telescopic end 171, and stressed by the telescopic end 171 to slide on the guide member 132. The first elastic member 134 is provided between the sliding member 133 and the elastic telescopic assembly support 131, and configured to restore the sliding member 133. In an example, the elastic telescopic assembly support 131 may have a rod-shaped structure. When having the rod-shaped structure, the elastic telescopic assembly support 131 may be fixed to the housing assembly 110 by a plurality of screws 206, and the plurality of screws 206 are arranged along an extending direction of the elastic telescopic assembly support 131. The guide member 132 may have a rod-shaped structure, and the rod-shaped guide member 132 may be perpendicular to the rod-shaped elastic telescopic assembly support 131. The rod-shaped sliding member 133 may be perpendicular to the rod-shaped guide member 132, or parallel to the rod-shaped elastic telescopic assembly support 131.

Figure 38:
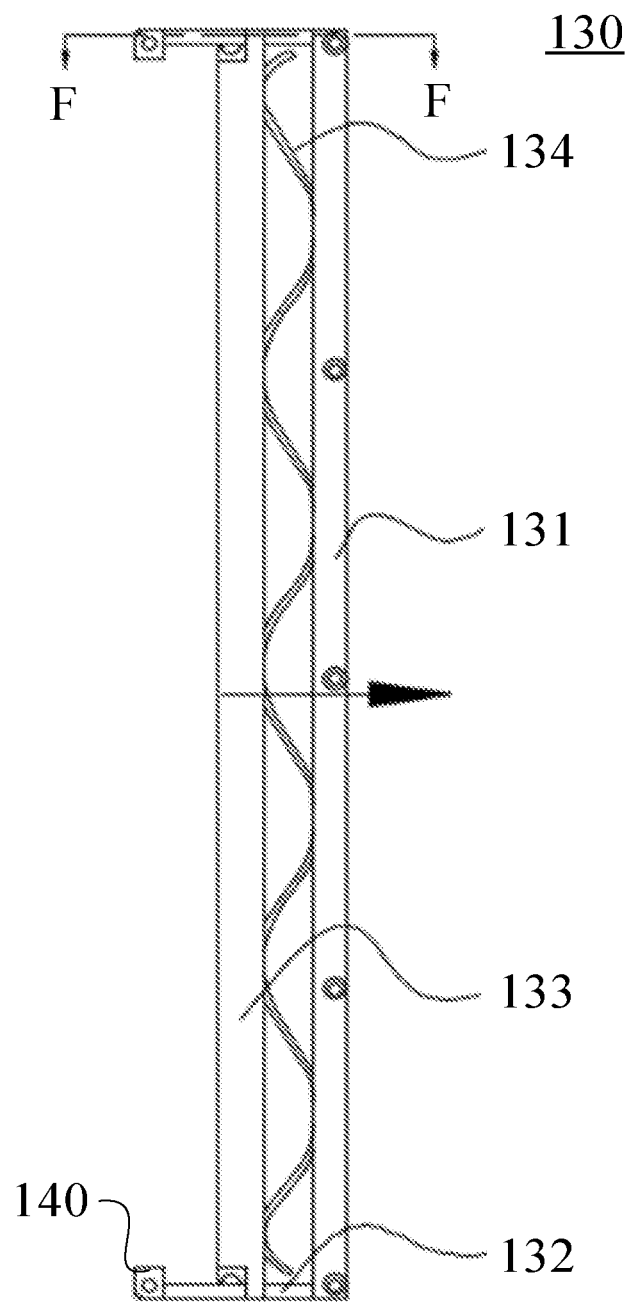
FIG. 38 shows a schematic diagram of an elastic telescopic assembly when a flexible screen in an extended state according to an exemplary embodiment of the present disclosure.
Figure 39:
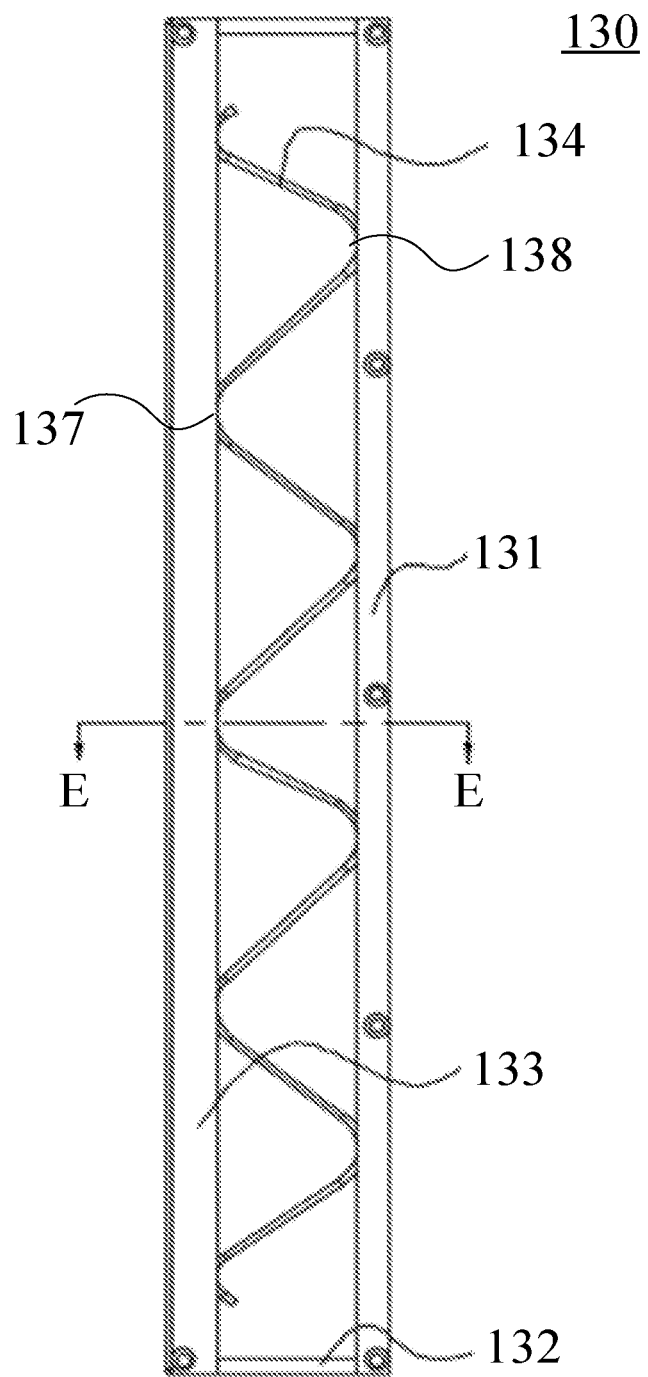
FIG. 39 shows a schematic diagram of an elastic telescopic assembly when a flexible screen in a retracted state according to an exemplary embodiment of the present disclosure.

FIG. 38 shows a schematic diagram of an elastic telescopic assembly 130 when a flexible screen 170 in an extended state according to an exemplary embodiment of the present disclosure, and FIG. 39 shows a schematic diagram of an elastic telescopic assembly 130 when a flexible screen 170 in a retracted state according to an exemplary embodiment of the present disclosure. When the telescopic end 171 of the flexible screen 170 drives the sliding member 133 to slide outwards from the housing assembly 110 to extend the flexible screen 170, the first elastic member 134 is compressed between the elastic telescopic assembly support 131 and the sliding member 133, referring to FIGS. 35 and 38. When the telescopic end 171 of the flexible screen 170 drives the sliding member 133 to slide from the outside to the housing assembly 110 to retract the flexible screen 170, the first elastic member 134 drives the sliding member 133 to restore, referring to FIGS. 36 and 39.

Figure 40:
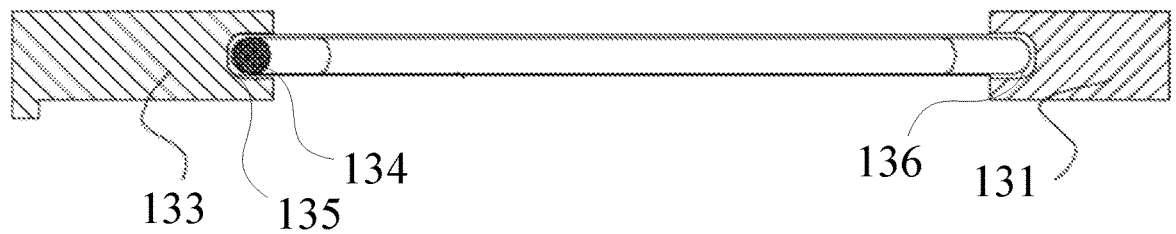
FIG. 40 shows a sectional view of the elastic telescopic assembly in FIG. 39 taken along line E-E.

FIG. 40 shows a sectional view of the elastic telescopic assembly 130 in FIG. 39 taken along line E-E. In some embodiments, referring to FIG. 40, the sliding member 133 is provided with a first limiting groove 135, the elastic telescopic assembly support 131 is provided with a second limiting groove 136 opposite to the first limiting groove 135, and the first elastic member 134 is limited in the first and second limiting grooves 135, 136, and extended and retracted along a direction from the first to second limiting grooves 135, 136. Thus, the first elastic member 134 is conveniently assembled between the elastic telescopic assembly support 131 and the sliding member 133, and conveniently extended and retracted along the direction from the first to second limiting grooves 135, 136.

In some embodiments, with continued reference to FIGS. 37 and 39, the first elastic member 134 includes a plurality of first abutting points 137 and a plurality of second abutting points 138. The first abutting points 137 abut against the first limiting groove 135, and the second abutting points 138 abut against the second limiting groove 136, such that the first elastic member 134 is stably extended and retracted between the elastic telescopic assembly support 131 and the sliding member 133. The first elastic member 134 may have various structures; and in some embodiments, the first and second abutting points 137, 138 are alternately arranged along an extending direction of the first limiting groove 135. In an example, the first abutting point 137 and two adjacent second abutting points 138 form a bent angle structure, and the second abutting point 138 and two adjacent first abutting points 137 form a bent angle structure, such that the first elastic member 134 is in a wavy structure along the extending direction of the first or second limiting groove 135, 136, so as to facilitate stable extension and retraction of the first elastic member 134 between the elastic telescopic assembly support 131 and the sliding member 133, and then, the sliding member 133 stably drives the telescopic end 171 to extend and retract, so as to stably extend and retract the flexible screen 170.

Further, in some embodiments, with continued reference to FIG. 37, the plurality of first abutting points 137 are evenly distributed and the plurality of second abutting points 138 are evenly distributed. Thus, elastic forces formed by the plurality of first abutting points 137 are substantially the same, and elastic forces formed by the plurality of second abutting points 138 are substantially the same, which is further beneficial for the first elastic member 134 to stably extend and retract between the elastic telescopic assembly support 131 and the sliding member 133, such that the first elastic member 134 applies a stable acting force to the sliding member 133, and then, the sliding member 133 stably drives the telescopic end 171 of the flexible screen 170 to extend and retract, so as to stably extend and retract the flexible screen 170. In an example, the sliding member 133 is provided with a first sliding groove 139, and the first sliding groove 139 is slidably fitted over the guide member 132, such that the sliding member 133 may be slid under the guide action of the guide member 132. In an example, a cross section of the first sliding groove 139 has a circular arc, square or other structure, and correspondingly, the sliding member 133 has a structure matched with the first sliding groove 139.

In some embodiments, with continued reference to FIGS. 37 and 38, two guide members 132 are provided and oppositely arranged at two ends of the elastic telescopic assembly support 131, and the two guide members 132 are slidably fitted in two ends of the sliding member 133 respectively, thus facilitating stable sliding of the sliding member 133 on the guide member 132.

Figure 41:
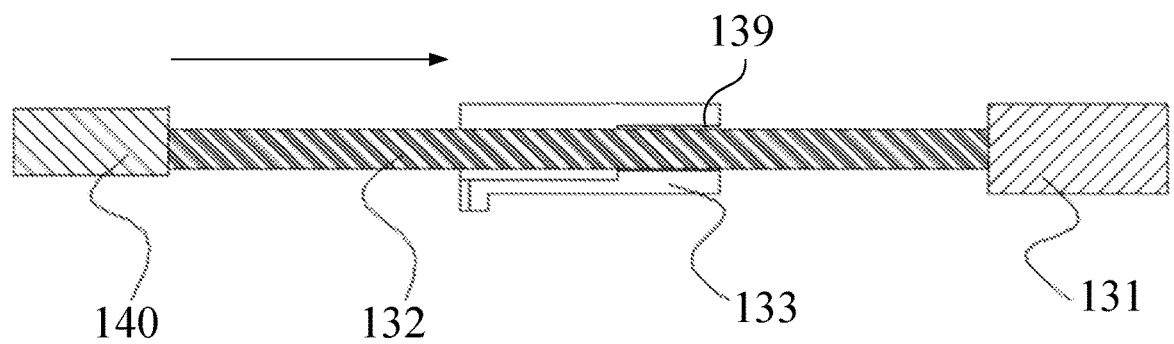
FIG. 41 shows a sectional view of the elastic telescopic assembly in FIG. 38 taken along line F-F.

FIG. 41 shows a sectional view of the elastic telescopic assembly 130 in FIG. 38 taken along line F-F. In some embodiments, with reference to FIGS. 38 and 41, the elastic telescopic assembly 130 further includes a limiting member 140 fixed to the guide member 132, and the sliding member 133 is slidable between the limiting member 140 and the elastic telescopic assembly support 131. Thus, the sliding member 133 is prevented from being separated from the guide member 132 when slid on the guide member 132, and the maximum sliding stroke of the sliding member 133 on the guide member 132 is limited by cooperation of the limiting member 140 and the elastic telescopic assembly support 131. The limiting member 140 may have a block structure. In an example, the limiting member 140 may be fixed to the guide member 132 by welding. In some embodiments, the limiting member 140 is further fixed to the housing assembly 110, such that the guide member 132 is firmly assembled to the housing assembly 110. In an example, the limiting member 140 is provided with a threaded hole, and the threaded hole and the housing assembly 110 are fastened by the screw to firmly fix the limiting member 140 to the housing assembly 110.

Figure 42:
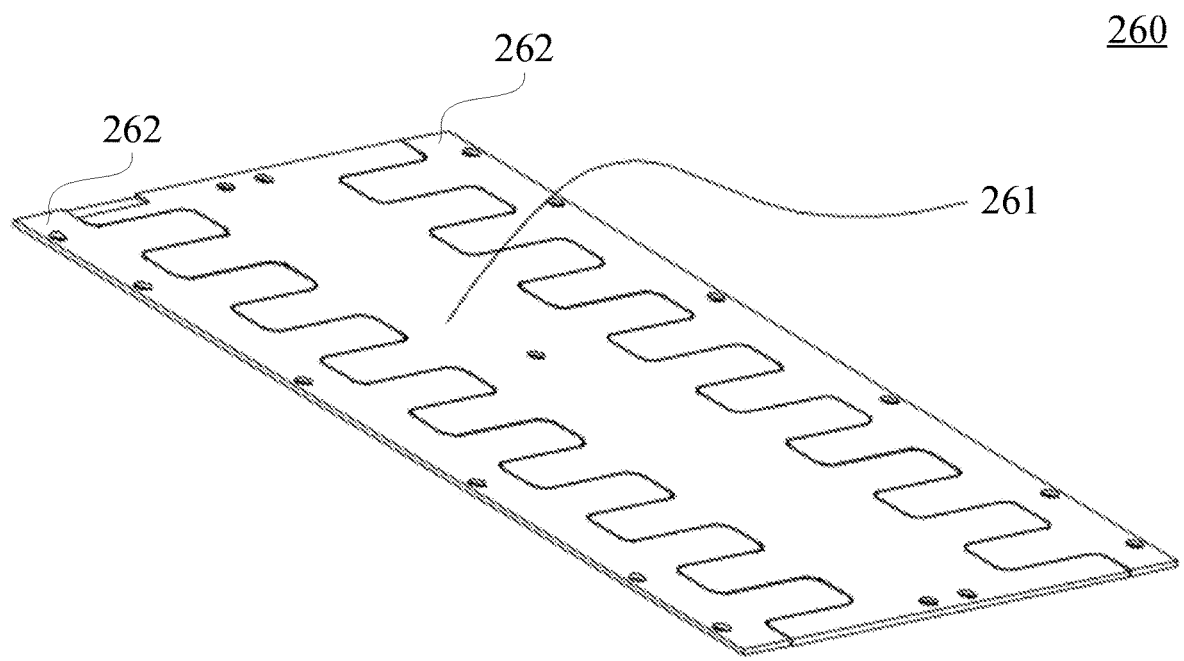
FIG. 42 shows a schematic diagram of retraction of a supporting plate assembly according to an exemplary embodiment of the present disclosure.
Figure 43:
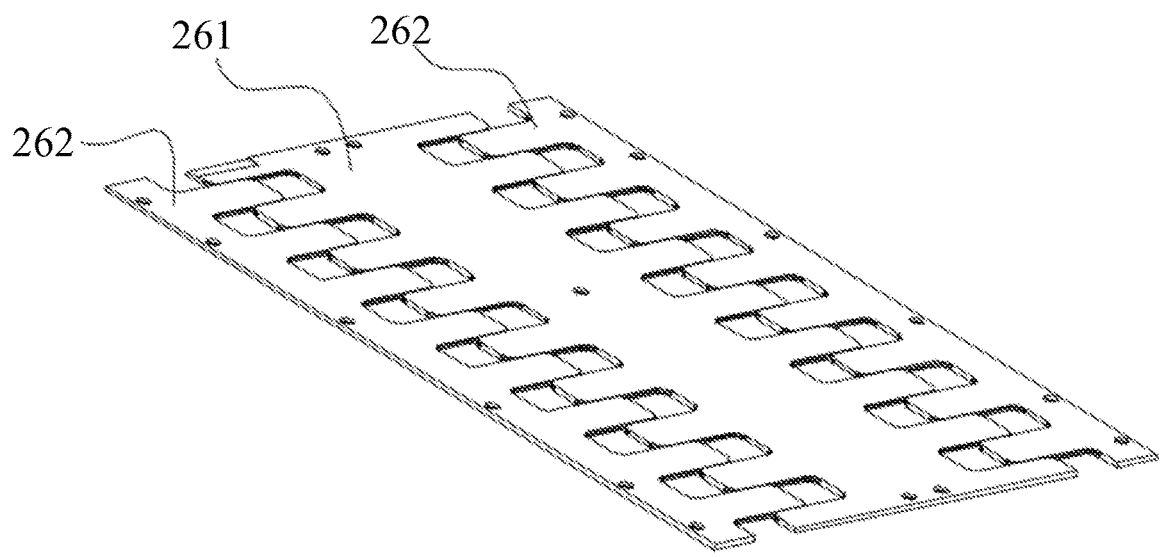
FIG. 43 shows a schematic diagram of extension of a supporting plate assembly according to an exemplary embodiment of the present disclosure.

FIG. 42 shows a schematic diagram of retraction of a supporting plate assembly according to an exemplary embodiment of the present disclosure, and FIG. 43 shows a schematic diagram of extension of a supporting plate assembly according to an exemplary embodiment of the present disclosure. In some embodiments, with reference to FIGS. 1, 2, 3, 42 and 43, the electronic device further includes the supporting plate assembly 260 provided between the sliding rail assembly 120 and the flexible screen 170. The supporting plate assembly 260 includes a fixed supporting plate 261 and at least one movable supporting plate 262, the fixed supporting plate 261 is fixed to the housing assembly 110, the movable supporting plate 262 is slidably coupled to the fixed supporting plate 261, and further coupled to the sliding rail 121. Part of the flexible screen 170 is fixed to the fixed supporting plate 261, and the telescopic end 171 extends around the movable supporting plate 262 to the rear surface of the sliding rail 121. It should be noted that the number of the movable supporting plates 262 may be equal to the number of the sliding rails 121, and the movable supporting plates 262 are coupled to the sliding rails 121 in one-to-one correspondence. In an example, the movable supporting plate 262 includes a first movable supporting plate and a second movable supporting plate which are arranged oppositely, the first movable supporting plate is coupled to the first sliding rail 124, and the second movable supporting plate is coupled to the second sliding rail 125. The supporting plate assembly 260 is configured to support the flexible screen 170 to ensure that the flexible screen 170 does not collapse in the extended and retracted states. In FIG. 3, the fixed supporting plate 261 includes a third region 204, and the flexible screen 170 is glued to the third region 204.

In some embodiments, a surface of the fixed supporting plate 261 facing the flexible screen 170 is flush with a surface of the movable supporting plate 262 facing the flexible screen 170. Thus, the flexible screen 170 may perform flat display in both extended and retracted states.

Figure 44:
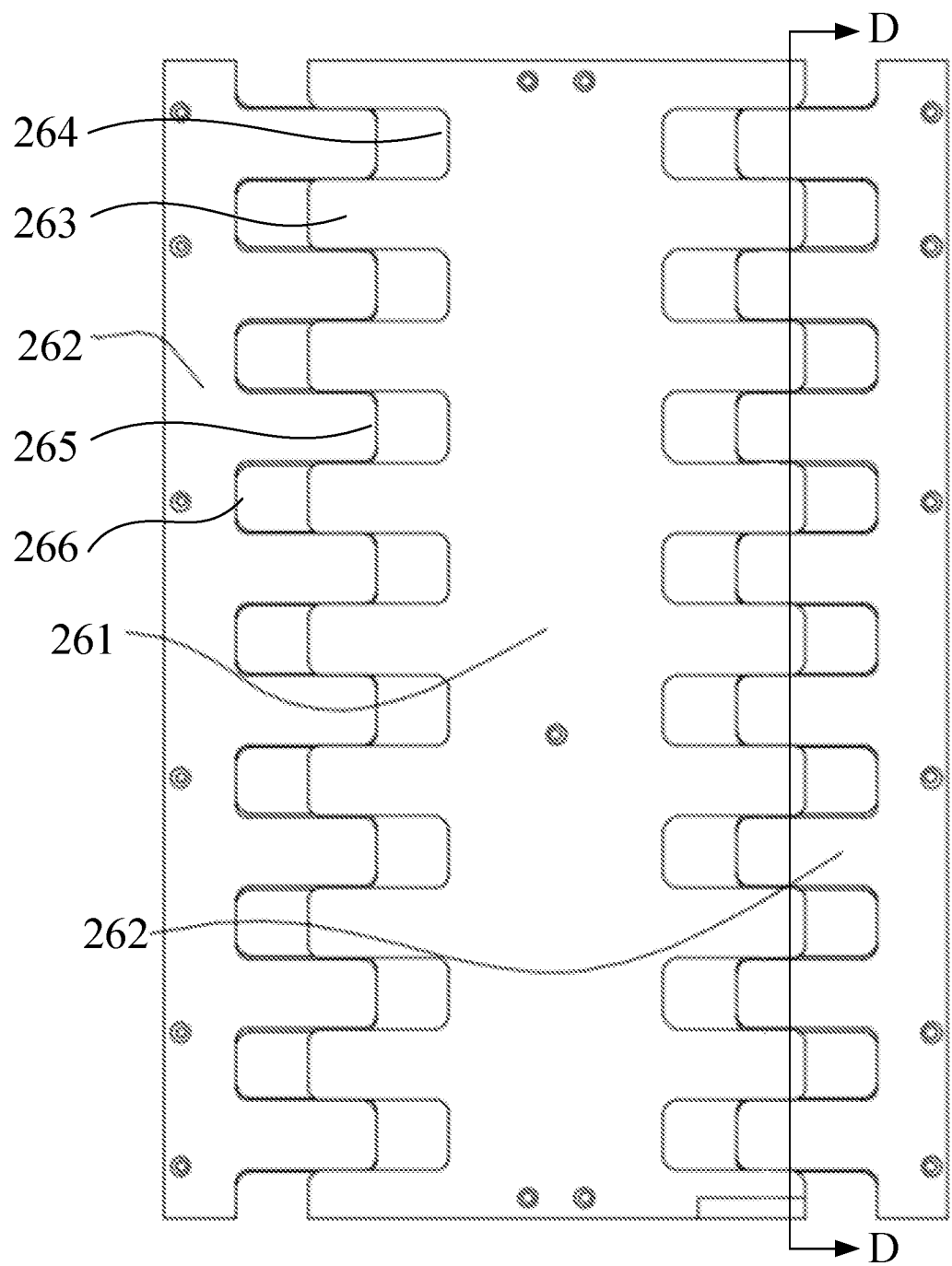
FIG. 44 shows a schematic diagram of extension of a supporting plate assembly according to an exemplary embodiment of the present disclosure.

FIG. 44 shows a schematic diagram of extension of a supporting plate assembly according to an exemplary embodiment of the present disclosure. In some embodiments, referring to FIG. 44, an edge of the fixed supporting plate 261 is provided with a plurality of first protrusions 263 and a plurality of first recesses 264; an edge of the movable supporting plate 262 is provided with a plurality of second protrusions 265 and a plurality of second recesses 266, the second protrusions 265 are slidably coupled to the first recesses 264, and the second recesses 266 are slidably coupled to the first protrusions 263. Thus, the first protrusion 263 is fitted with the second recess 266, and the first recess 264 is fitted with the second protrusion 265, such that surfaces of the movable and fixed supporting plates 262, 261 are flush after the supporting plate assembly 260 is extended, thus achieving a flat supporting effect on the flexible screen 170. In an example, the plurality of first protrusions 263 and the plurality of first recesses 264 are arranged alternately, and the plurality of second protrusions 265 and the plurality of second recesses 266 are arranged alternately.

Figure 45:
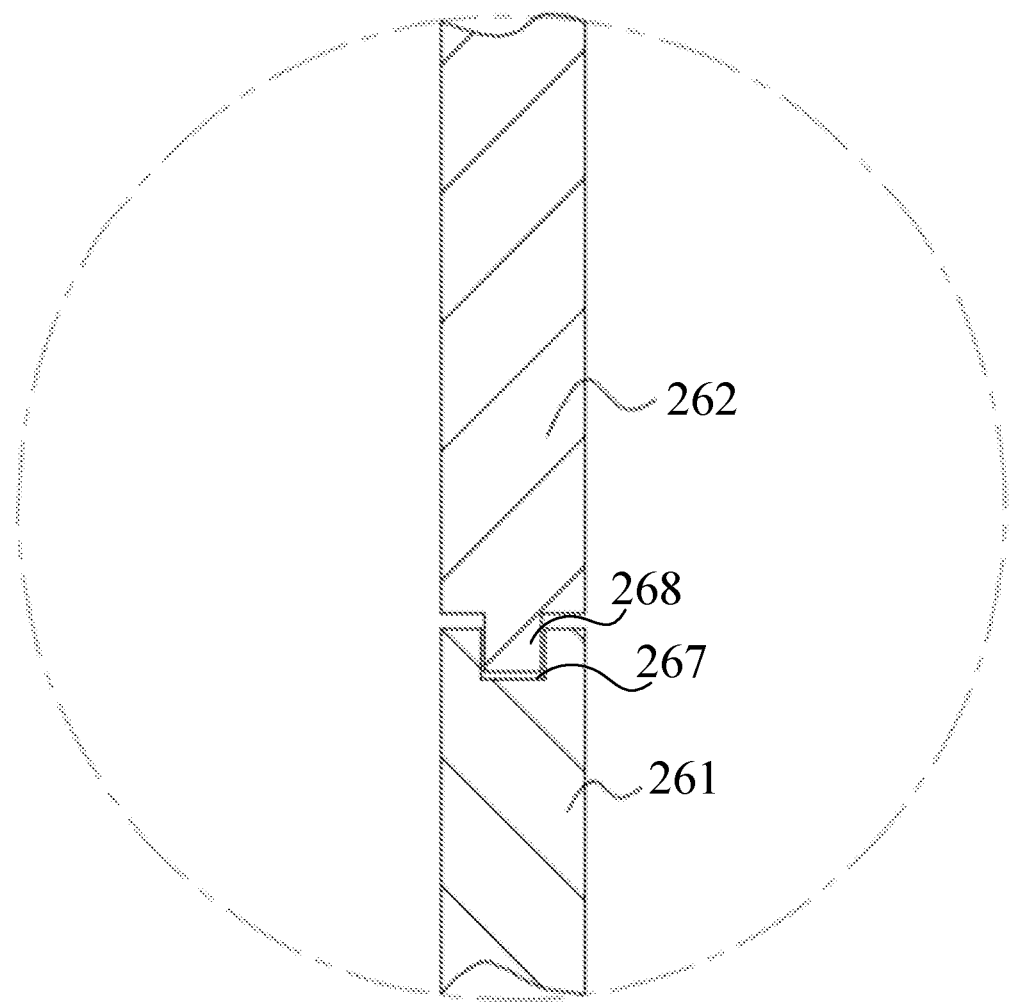
FIG. 45 is a partial enlarged view of the supporting plate assembly in FIG. 44 taken along line D-D.

In some embodiments, one of an edge of the first protrusion 263 and an edge of the second recess 266 is provided with a third sliding groove, and the other is provided with a first sliding portion matched with the third sliding groove; and one of an edge of the second protrusion 265 and an edge of the first recess 264 is provided with a fourth sliding groove, and the other is provided with a second sliding portion matched with the fourth sliding groove, thus facilitating surface flatness of the supporting plate assembly 260. In an example, a cross section of the third sliding groove may have a T-groove structure, and the first sliding portion may have a structure matched with the third sliding groove. In an example, a cross section of the fourth sliding groove may have a T-groove structure, and the second sliding portion may have a structure matched with the fourth sliding groove. FIG. 45 is a partial enlarged view of the supporting plate assembly in FIG. 44 taken along line D-D. With continued reference to FIG. 45, the fixed supporting plate 261 may be provided with the third sliding groove 267 or the fourth sliding groove, and the movable supporting plate 262 may be provided with the first sliding portion 268 matched with the third sliding groove 267 or a second sliding portion matched with the fourth sliding groove.

Figure 46:
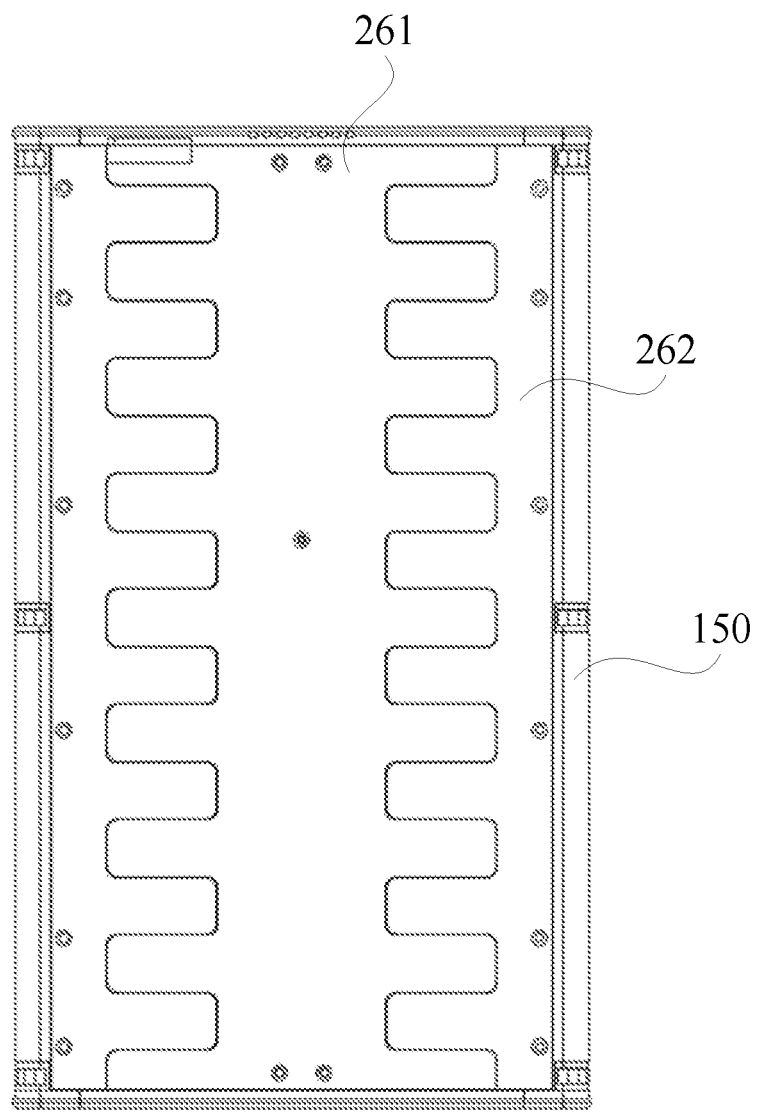
FIG. 46 shows a partial schematic structural diagram of an electronic device according to an exemplary embodiment of the present disclosure.
Figure 47:
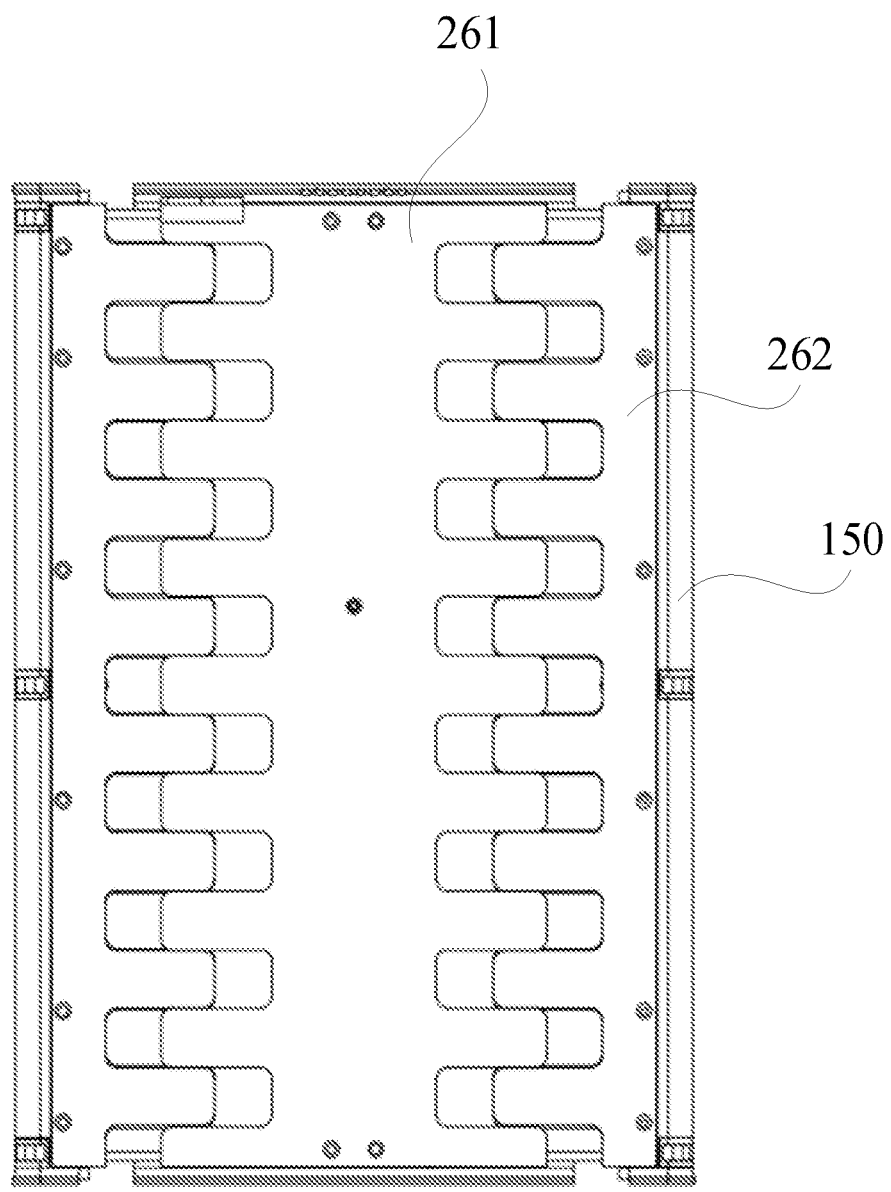
FIG. 47 shows a partial schematic structural diagram of an electronic device according to an exemplary embodiment of the present disclosure.
Figure 48:
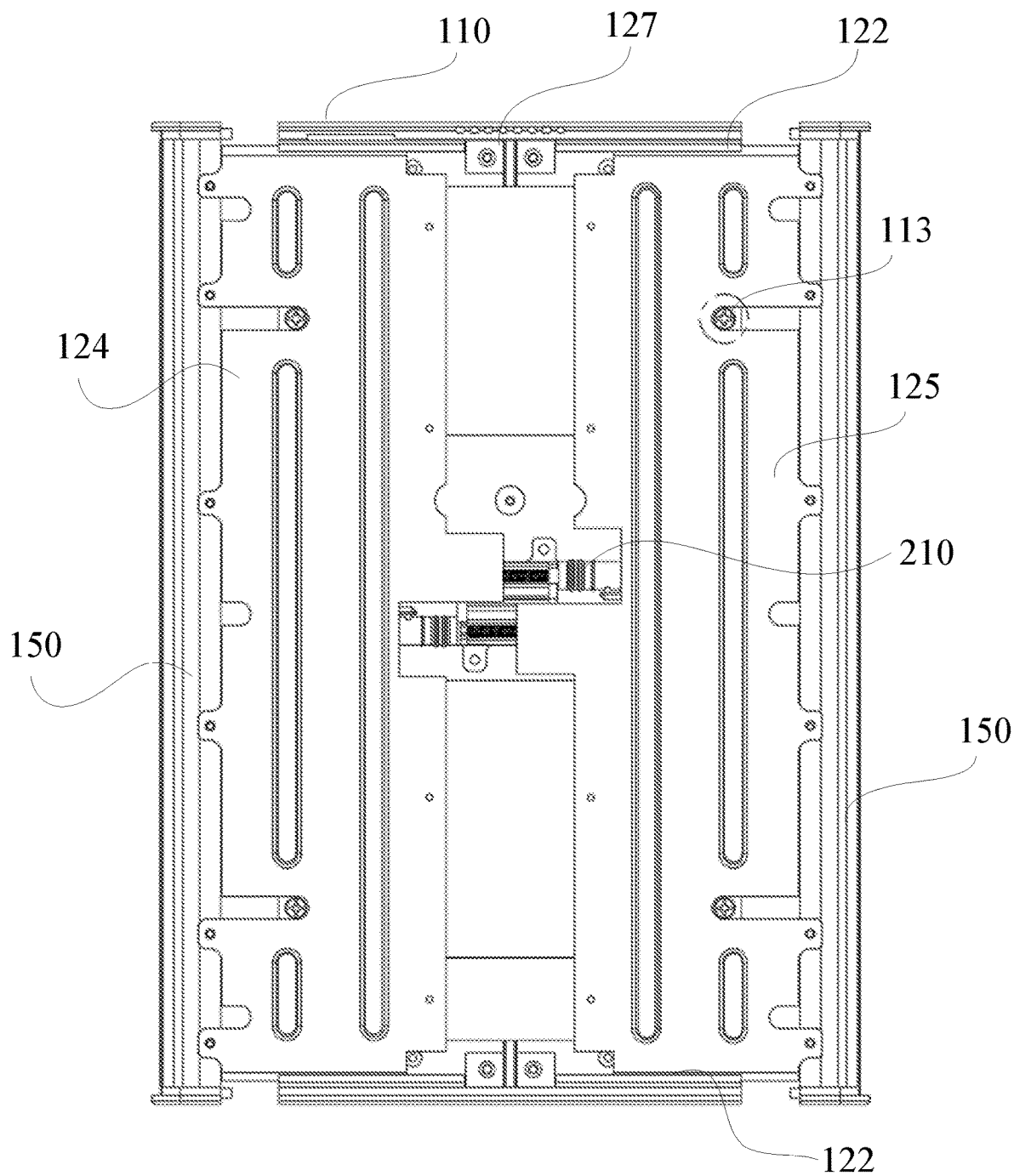
FIG. 48 shows a partial schematic structural diagram of an extended electronic device according to an exemplary embodiment of the present disclosure.
Figure 49:
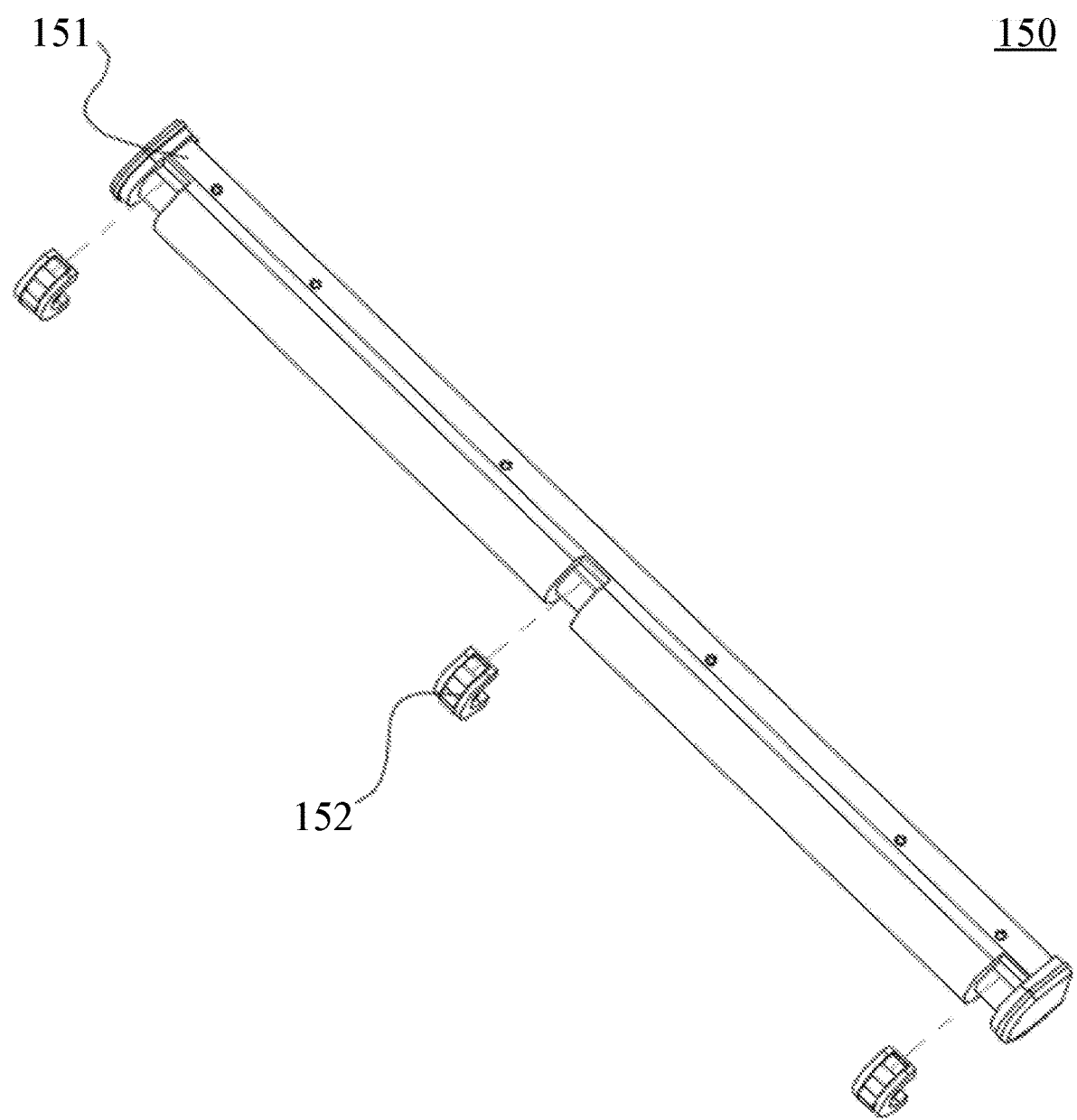
FIG. 49 shows a schematic exploded diagram of a telescopic support assembly according to an exemplary embodiment of the present disclosure.

FIG. 46 shows a partial schematic structural diagram of an electronic device according to an exemplary embodiment of the present disclosure, FIG. 47 shows a partial schematic structural diagram of an electronic device according to an exemplary embodiment of the present disclosure, FIG. 48 shows a partial schematic structural diagram of an extended electronic device according to an exemplary embodiment of the present disclosure, and FIG. 49 shows a schematic exploded diagram of a telescopic support assembly 150 according to an exemplary embodiment of the present disclosure. With reference to FIGS. 46 to 49, the electronic device further includes at least one telescopic support assembly 150 including a telescopic support 151 and a rolling member 152. The telescopic support 151 is fixed at the edge of the sliding rail 121, the rolling member 152 is assembled to an outer surface of the telescopic support 151, the telescopic end 171 extends around the telescopic support assembly 150 to the rear surface of the sliding rail 121, and a rear surface of the flexible screen 170 contacts the rolling member 152. Friction experienced by the flexible screen 170 during extension and retraction is reduced by designing the rolling member 152. In an example, the telescopic support 151 has a U-shaped cross section, and the rolling member 152 may be configured as a U-shaped bearing and welded to the telescopic support 151, facilitating extension and retraction of the flexible screen 170. In an example, two telescopic support assemblies 150 may be provided, one telescopic support assembly 150 is assembled to the edge of the first sliding rail 124 sliding outwards, and the other telescopic support assembly 150 is assembled to the edge of the second sliding rail 125 sliding outwards.

In conclusion, in the electronic device according to the embodiments of the present disclosure, part of the flexible screen 170 is provided at the front surface of the sliding rail 121 and fixed to the housing assembly 110, the telescopic end 171 extends around the edge of the sliding rail 121 to the rear surface of the sliding rail 121 and is coupled to the elastic telescopic assembly 130, and when the sliding rail 121 is slid outwards from the housing assembly 110, the telescopic end 171 pulls the elastic telescopic assembly 130, and the flexible screen 170 is stably extended under the buffer effect of the elastic telescopic assembly 130. When the sliding rail 121 is slid from the outside to the housing assembly 110, the elastic telescopic assembly 130 may restore, and the flexible screen 170 is stably retracted by the telescopic end 171 under the buffer effect of the elastic telescopic assembly 130. The flexible screen 170 of the electronic device may be stably extended and retracted, such that the user may conveniently use screens with different sizes, thus improving the user experiences; and compared with a foldable screen, the electronic device has a reduced weight, and is convenient for the user to carry. The flexible screen 170 may be automatically extended and retracted by providing the driving assembly 210, and the driving assembly 210 has a flexible arrangement form. The flexible screen 170 may perform flat display by the supporting plate assembly 260, and is prevented from collapsing during extension and retraction. The electronic device has a simple structure and may easily realize mass production.

The above embodiments of the present disclosure may complement each other without conflict.

The above descriptions are merely embodiments of the disclosure and are not intended to restrict the disclosure. Any modification, equivalent replacement, or improvement made within the spirit and principle of the present disclosure shall be included in the protection scope of the present disclosure.

What is claimed is:
1. An electronic device, comprising:
a housing assembly;
a sliding rail assembly coupled with the housing assembly and comprising at least one sliding rail, the sliding rail comprising a front surface and a rear surface opposite the front surface;
at least one elastic telescopic assembly located at the rear surface of the sliding rail assembly and coupled with the housing assembly; and
a flexible screen, part of the flexible screen located at the front surface of the sliding rail and coupled with the housing assembly, the flexible screen comprising at least one telescopic end extending around an edge of the sliding rail to the rear surface of the sliding rail, the at least one telescopic end being coupled with the elastic telescopic assembly, the elastic telescopic assembly being stressed by the telescopic end to extend and retract, and the sliding rail being slidable outwards from the housing assembly to extend the flexible screen and slidable towards the housing assembly to retract the flexible screen.

2. The electronic device according to claim 1, wherein the elastic telescopic assembly comprises an elastic telescopic assembly support, a guide member, a sliding member and a first elastic member; and
the elastic telescopic assembly support is coupled to the housing assembly, the guide member is coupled to the elastic telescopic assembly support, the sliding member is slidably coupled to the guide member, the sliding member is coupled to the telescopic end, and stressed by the telescopic end to slide on the guide member, and the first elastic member is located between the sliding member and the elastic telescopic assembly support, and configured to restore the sliding member.

3. The electronic device according to claim 2, wherein the sliding member defines a first limiting groove, the elastic telescopic assembly support defines a second limiting groove opposite to the first limiting groove, and the first elastic member is limited in the first and second limiting grooves, and extended and retracted in a direction from the first to second limiting grooves.

4. The electronic device according to claim 3, wherein the first elastic member comprises a plurality of first abutting points and a plurality of second abutting points, the first abutting points abut against the first limiting groove, and the second abutting points abut against the second limiting groove.

5. The electronic device according to claim 4, wherein the first and second abutting points are alternately arranged along an extending direction of the first limiting groove.

6. The electronic device according to claim 2, wherein the sliding member defines a first sliding groove slidably fitted over the guide member.

7. The electronic device according to claim 2, wherein the elastic telescopic assembly further comprises a limiting member fixed to the guide member, and the sliding member is slidable between the limiting member and the elastic telescopic assembly support.

8. The electronic device according to claim 1, wherein the sliding rail assembly further comprises at least one fixing member coupled with the housing assembly and defining a sliding groove, and the sliding rail has an end slidably limited in the sliding groove.

9. The electronic device according to claim 8, wherein the sliding rail assembly further comprises a buffer limiting member located at the fixing member and configured to abut against the sliding rail sliding towards the housing assembly from the outside.

10. The electronic device according to claim 1, wherein a limiting portion is located at an edge of the housing assembly, and the sliding rail defines with a limiting groove, and slid outwards from the housing assembly, such that the limiting portion is limited in the limiting groove.

11. The electronic device according to claim 1, wherein the electronic device further comprises a driving assembly assembled to the housing assembly, coupled to the sliding rail, and configured to drive the sliding rail to slide.

12. The electronic device according to claim 11, wherein the driving assembly comprises a driving assembly support fixed to the housing assembly and at least one driving unit assembled to the driving assembly support and configured to drive the sliding rail to slide.

13. The electronic device according to claim 12, wherein the driving unit comprises a first driving member, a first transmission lead screw, a first guide rod and a first pushing member;
the first transmission lead screw and the first guide rod are assembled to the driving assembly support, the first driving member is coupled to an end of the first transmission lead screw, and the first driving member is configured to drive the first transmission lead screw to rotate; and
the first pushing member defines a first transmission hole and a first sliding hole, the first transmission hole is drivingly coupled to the first transmission lead screw, the first sliding hole is slidably fitted over the first guide rod, and the first pushing member is configured to push the sliding rail to slide.

14. The electronic device according to claim 12, the at least one sliding rail including at least two sliding rails, the driving unit comprises a second transmission lead screw, a third transmission lead screw, a second guide rod, a second driving member and a second pushing member, the second transmission lead screw and the second guide rod are assembled to the driving assembly support, the third transmission lead screw is axially movably assembled to the driving assembly support, and the second driving member is configured to drive the second transmission lead screw to rotate; and
the second pushing member defines a second sliding hole, a second transmission hole and a third transmission hole, the second sliding hole is slidably fitted over the second guide rod, the second transmission hole is drivingly coupled to the second transmission lead screw, the third transmission hole is drivingly coupled to the third transmission lead screw, the third transmission lead screw and the second pushing member have opposite moving directions, the second pushing member is configured to drive one sliding rail to slide, and the third transmission lead screw is configured to drive the other sliding rail to slide.

15. The electronic device according to claim 14, wherein the driving unit further comprises an adapter, an end of the third transmission lead screw is rotatably coupled to the adapter, and the third transmission lead screw drives the sliding rail to slide by the adapter.

16. The electronic device according to claim 12, wherein the driving assembly further comprises at least one elastic buffer assembly fixed to the sliding rail and coupled to the driving unit.

17. The electronic device according to claim 16, wherein the elastic buffer assembly comprises a first fixed portion, a second fixed portion, a third guide rod and a second elastic member; and
the first and second fixed portions are fixed to the sliding rail, the third guide rod is fixed between the first and second fixed portions, the second elastic member is fitted over the third guide rod, and the driving unit pushes the second elastic member to extend and retract on the third guide rod.

18. The electronic device according to claim 17, wherein the elastic buffer assembly further comprises a guide sleeve slidably fitted over the third guide rod and coupled to an end of the second elastic member and the driving unit.

19. The electronic device according to claim 1, wherein the electronic device further comprises a supporting plate assembly located between the sliding rail assembly and the flexible screen; and
the supporting plate assembly comprises a fixed supporting plate and at least one movable supporting plate, the fixed supporting plate is fixed to the housing assembly, the movable supporting plate is slidably coupled to the fixed supporting plate, and further coupled to the sliding rail, the part of the flexible screen is fixed to the fixed supporting plate, and the telescopic end extends around the movable supporting plate to the rear surface of the sliding rail.

20. The electronic device according to claim 1, wherein the electronic device further comprises at least one telescopic support assembly comprising a telescopic support and a rolling member, the telescopic support is fixed at the edge of the sliding rail, the rolling member is assembled to an outer surface of the telescopic support, the telescopic end extends around the telescopic support assembly to the rear surface of the sliding rail, and a rear surface of the flexible screen contacts the rolling member.

* * * * *